United States Patent [19]
Matsuda et al.

[11] Patent Number: 5,352,907
[45] Date of Patent: Oct. 4, 1994

[54] THIN-FILM TRANSISTOR

[75] Inventors: Kunihiro Matsuda, Sagamihara; Hiromitsu Ishii, Tokorozawa; Naohiro Konya, Hino, all of Japan

[73] Assignee: Casio Computer Co., Ltd., Tokyo, Japan

[21] Appl. No.: 856,509

[22] Filed: Mar. 24, 1992

[30] Foreign Application Priority Data

| Mar. 29, 1991 | [JP] | Japan | 3-088992 |
| Mar. 29, 1991 | [JP] | Japan | 3-088993 |
| Mar. 29, 1991 | [JP] | Japan | 3-088994 |
| Mar. 29, 1991 | [JP] | Japan | 3-091724 |
| Jun. 27, 1991 | [JP] | Japan | 3-181624 |

[51] Int. Cl.$^5$ .............. H01L 27/01; H01L 27/13; H01L 29/78
[52] U.S. Cl. .............. 257/59; 257/61; 257/72; 257/506; 257/752; 257/761
[58] Field of Search .............. 257/59, 72, 61, 506, 257/741, 752, 761

[56] References Cited
U.S. PATENT DOCUMENTS

| 4,404,578 | 9/1983 | Takafuji et al. | 257/66 |
| 5,036,370 | 7/1991 | Miyago et al. | 257/72 |

FOREIGN PATENT DOCUMENTS 0270323 6/1988 European Pat. Off. .............. 257/59

Primary Examiner—Sara W. Crane
Attorney, Agent, or Firm—Frishauf, Holtz, Goodman & Woodward

[57] ABSTRACT

A thin-film transistor includes a gate electrode and a semiconductor film consisting of amorphous silicon, formed on an insulating substrate to oppose each other through a gate insulating film, ohmic contact layers composed of n-type amorphous silicon doped with an impurity, electrically insulated from each other on the semiconductor film, and electrically connected to the semiconductor film, and source and drain electrodes arranged on the semiconductor film with a predetermined gap to form a channel portion, and electrically connected to the semiconductor film through the ohmic contact layers. The gate electrode and a portion surrounding the gate electrode are entirely formed into a continuous metal oxide film by a chemical reaction.

24 Claims, 22 Drawing Sheets

THIN-FILM TRANSISTOR

BACKGROUND OF THE INVENTION

1. Field of the Invention

The present invention relates to a thin-film transistor formed by sequentially stacking thin films on an insulating substrate, and a thin-film transistor array for a liquid crystal display element, in which thin-film transistors, pixel electrodes connected to the thin-film transistors, and conductive lines for controlling the thin-film transistors are arranged.

2. Description of the Related Art

Liquid crystal display devices are widely used for the displays of personal computers, portable television sets, and the like. As such liquid crystal display devices, simple matrix type liquid crystal elements such as a twisted nematic liquid crystal element (TN-LCD) and a super-twisted nematic liquid crystal element (STN-LCD) are used.

A TN-LCD is advantageous in a simple structure and hence can be easily manufactured. However, since the contrast of the TN-LCD deteriorates as the time division count is increased, a high-resolution or large-screen liquid crystal display device cannot be obtained.

An STN-LCD allows time-division driving with a large time division count. However, since the response speed of the STN-LCD is low, actually displayed images cannot follow changes in images to be displayed, resulting in picture rolling. Therefore, clear display cannot be performed.

In order to solve this problem, an active matrix type liquid crystal element (TFT-LCD) has been developed. In this liquid crystal element, thin-film transistors (TFT), each formed by stacking thin films, are respectively connected to pixel electrodes arranged in a matrix so that the transmittance of each pixel of the liquid crystal element is controlled by controlling a corresponding one of the thin-film transistors.

In this TFT-LCD structure, a thin-film transistor array (TFT panel), in which pixel electrodes, TFTs, and two types of conductive lines for controlling the TFTs and supplying data signals thereto are mounted on an insulating substrate, and an opposing substrate having opposing electrodes formed thereon are arranged to oppose each other with a predetermined gap, and a liquid crystal material is sealed in this gap.

As the above-described TFTs, a stagger type transistor, an inverse stagger type transistor, a coplanar type transistor, an inverse coplanar type transistor, and the like are known. Of these TFTs, the structure of an inverse stagger type TFT will be described in detail below with reference to FIG. 1.

This thin-film transistor comprises a gate electrode 2 formed on an insulating substrate 1 consisting of glass or the like, a gate insulating film 3 covering the gate electrode 2, an i-type semiconductor layer 4 formed on the gate insulating film 3 to oppose the gate electrode 2, and source and drain electrodes 6s and 6d formed on two sides of the i-type semiconductor layer 4 through an n-type semiconductor layer 5.

A blocking insulating film 7 is formed on the channel region of the i-type semiconductor layer 4 to prevent the surface of the i-type semiconductor layer 4 from being etched when a portion of, the n-type semiconductor layer 5, corresponding to the channel region is removed by etching.

The TFT is manufactured in the following steps.

In the first step, a metal film is formed on the substrate 1, and the metal film is patterned by photolithography to form the gate electrode 2.

In the next step, the gate insulating film 3, the i-type semiconductor layer 4, and the blocking insulating film 1 are sequentially formed on the substrate 1, on which the gate electrode 2 has already been formed. The blocking insulating film 7 and the i-type semiconductor layer 4 are patterned by photolithography.

In the subsequent step, the n-type semiconductor layer 5 and a source/drain electrode metal film are sequentially formed on the substrate 1, and the metal film is patterned by photolithography to form the source and drain electrodes 6s and 6d. In addition, the n-type semiconductor layer 5 is removed by etching except for portions under the source and drain electrodes 6s and 6d.

According to the above-described conventional TFT, however, since the gate electrode 2 as a lower electrode is formed by patterning the metal film on the substrate 1 using a photolithographic method, stepped portions, each having a height corresponding to the thickness of the gate electrode 2, are formed at the edge portions of the gate electrode 2, as shown in FIG. 1.

For this reason, in the conventional TFT, the thickness of the gate insulating film 3, which is formed after the gate electrode 2 is formed, is reduced at portions of the transistor element region which correspond to the edge portions of the gate electrode 2, thus decreasing the breakdown voltage at these portions. As a result, short-circuiting tends to occur between the gate electrode 2 and the source and drain electrodes 6s and 6d.

The gate electrode 2 and the source and drain electrodes 6s and 6d of the TFT are generally composed of a metal having a relatively high resistivity, e.g., Ta (tantalum), Ta-Mo (tantalum-molybdenum alloy), or Cr (chromium). Therefore, in order to decrease the resistance of each electrode, its film thickness is preferably increased. However, if the thickness of the gate electrode 2 is increased, the above-mentioned stepped portions are increased in size, and the thickness of the gate insulating film 3 is excessively reduced at portions corresponding to the edge portions of the gate electrode 2, resulting in a further decrease in breakdown voltage.

Such a problem is not limited to the inverse stagger type thin-film transistor but is equally posed in the stagger type, coplanar type, and inverse coplanar type thin-film transistors. In such conventional thin-film transistors, the lower electrode (the source/drain electrode in the stagger and coplanar type; the gate electrode in the inverse coplanar type) under the gate insulating film is formed by patterning the deposited metal film using a photolithographic method. For this reason, the thickness of the gate insulating film is reduced at portions of the transistor element region which correspond to the edge portions of the lower electrode, and the breakdown voltage at these portions is decreased. As a result, short-circuiting tends to occur between the gate electrode and the source and drain electrodes.

Furthermore, in the above-described TFT, since the blocking insulating film 7 is generally composed of the same insulating material as that of the gate insulating film 3, if the i-type semiconductor layer 4 has a pinhole, an etchant which is applied to the blocking insulating film 7 to pattern it reaches the gate insulating film 3 through the pinhole in the i-type semiconductor layer 4. Consequently, the gate insulating film 3 is also etched.

For this reason, in the conventional thin-film transistor described above, a pinhole defect is caused in the gate insulating film 3 in a manufacturing step, and the gate electrode 2 and the source and drain electrodes 6s and 6d are short-circuited through the pinhole.

SUMMARY OF THE INVENTION

It is an object of the present invention to provide a TFT which allows simplification of the manufacturing process and reduction in defect in the manufacturing steps, and a TFT panel or array using the TFTs and designed for a liquid crystal element.

In order to achieve the above object, according to the present invention, there is provided a thin-film transistor comprising:

an insulating substrate;

a gate electrode and a semiconductor film formed on the insulating substrate to oppose each other through a gate insulating film;

ohmic contact layers composed of n-type semiconductor films doped with an impurity, electrically insulated from each other on the semiconductor film, and electrically connected to the semiconductor film; and source and drain electrodes arranged on the semiconductor film with a predetermined gap to form a channel portion, and electrically connected to the semiconductor film through the ohmic contact layers, wherein at least one of the conductive films constituting the gate electrode, the ohmic contact layers, and the source and drain electrodes except for a pattern having a predetermined shape is entirely formed into a continuous metal oxide film by a chemical reaction.

According to the present invention having the above-described arrangement, patterning of the conductive films, e.g., the gate electrode, the ohmic contact layers, and the source and drain electrodes, is performed such that a film portion except for a desired pattern is entirely anodized to be formed into an insulating metal oxide film, while only the designed pattern portion has conductivity. Since the insulating film is left in the portion other than the desired pattern, no stepped portions are formed by the patterning process, and a flat surface can be obtained. Therefore, the insulating film formed on the flat surface is free from defects due to the stepped portions of the lower layer. In addition, according to the present invention, since the etching step in the conventional method is replaced with the anodizing step, the manufacturing process is not complicated.

Especially, in the present invention, since portions, of the ohmic contact layers and/or the source and drain electrodes, which correspond to the channel portion of the semiconductor film are anodized to form the channel portion so as to separate the ohmic contact layers and/or the source and drain electrodes from each other, the ohmic contact layers consisting of an n-type semiconductor need not be removed by etching. Therefore, the semiconductor film is free from damage due to etching of ohmic contact layers, which is caused because the ratio of the etching rate of an n-type semiconductor to that of an i-type semiconductor is small. This improves and stabilizes the element characteristics of the TFT. Furthermore, since the ohmic contact layers are not etched, there is no need to form a blocking layer for preventing the semiconductor film from being damaged when the upper layer is etched. That is, no blocking layer consisting of a silicon nitride film or the like need be patterned. Therefore, the gate insulating film is free from defects caused when an etchant permeates the film through a pinhole in the semiconductor film in etching of the blocking layer. In addition, since a film forming step by CVD can be omitted, the manufacturing process can be simplified.

In addition, the present invention comprises an insulating substrate, a gate electrode and a semiconductor film formed on the insulating substrate to oppose each other through a gate insulating film, a blocking layer, entirely composed of a metal oxide film formed by a chemical reaction, and formed at a portion corresponding to a channel portion of the semiconductor film, for preventing etching of the channel portion, ohmic contact layers composed of n-type semiconductor films doped with an impurity, electrically separated from each other, and electrically connected to the semiconductor film, and source and drain electrodes arranged with a predetermined gap and electrically connected to the semiconductor film through the ohmic contact layers. According to such an arrangement, since the above-mentioned blocking layer is composed of an insulating film formed by anodizing a metal film, patterning of the blocking layer as a metal film can be performed by etching, and the metal layer can be formed into an insulating film by anodizing after a desired pattern is formed on the metal layer. Since etching of this metal film can be performed by using an etchant having a large etching rate for a semiconductor film, the gate insulating film is free from the above-mentioned defects caused when patterning of the blocking layer is performed. Therefore, defects caused by interlayer short-circuiting in the TFT can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

[First Embodiment]

The first embodiment of the present invention will be described below with reference to FIGS. 2 to 3F.

Figure 1:
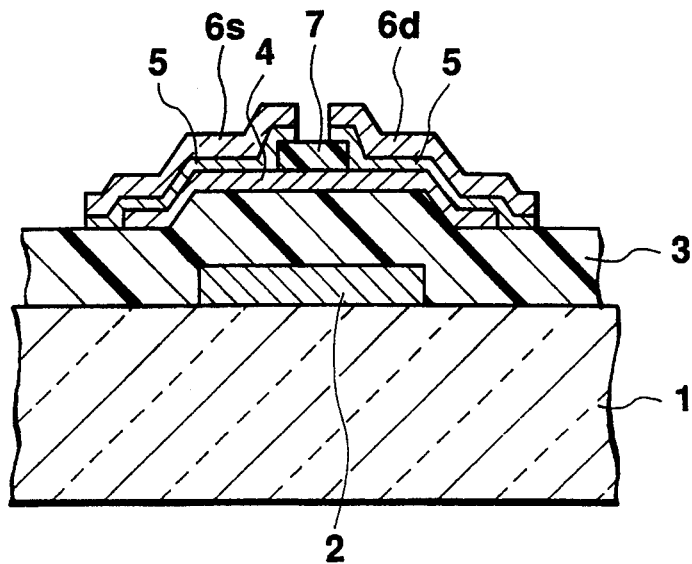
FIG. 1 is a sectional view showing the structure of a conventional TFT element.
Figure 2:
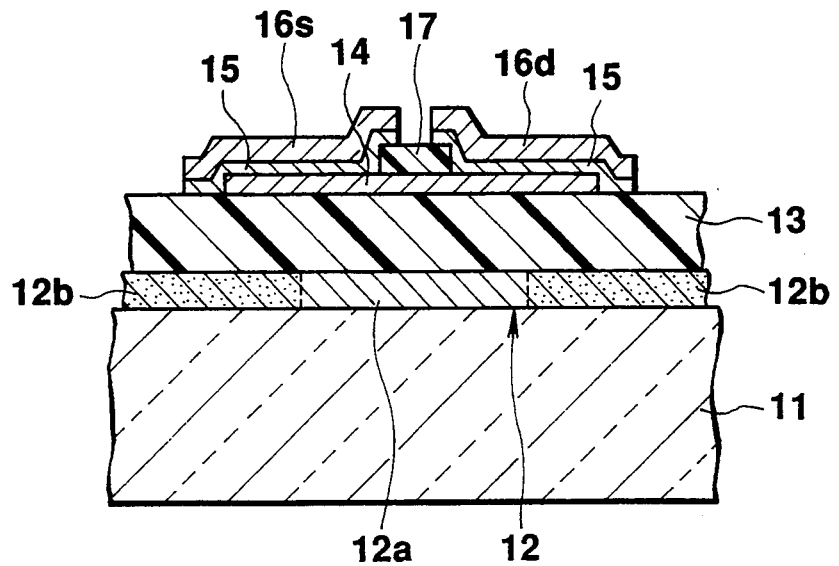
FIG. 2 is a sectional view showing the structure of a TFT element according to the first embodiment of the present invention.

FIG. 2 is a sectional view of a thin-film transistor.

The thin-film transistor of this embodiment is of an inverse stagger type, which comprises a gate electrode 12a formed on an insulating substrate 11 consisting of glass or the like, a gate insulating film 13 covering the gate electrode 12a, a semiconductor film 14 consisting of an i-type semiconductor layer and formed on the gate insulating film 13 to oppose the gate electrode 12a, and source and drain electrodes 16s and 16d formed on the two sides of the semiconductor film 14 through n-type semiconductor layers 15. Reference numeral 17 denotes a blocking insulating film formed on the channel region of the semiconductor film 14.

The gate electrode 12a as the lower electrode of the thin-film transistor is constituted by part of a metal film 12 which is formed on almost the entire 10 surface of the substrate 11. Portions of the metal film 12 other than the gate electrode 12a are entirely anodized to be formed into oxide insulating layers 12b.

Note that in this embodiment, the wiring portion (not shown) of the gate electrode 12a is also composed of the metal film 12. Therefore, the metal film 12 is anodized except for the gate electrode 12a and the wiring portion.

A method of manufacturing the transistor having the above-described arrangement will be described below with reference to FIGS. 3A to 3F.

[Step 1]

Figure 3A:
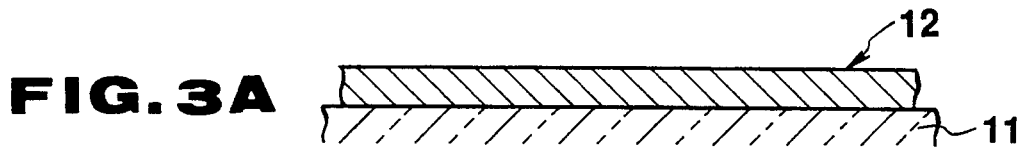
FIGS. 3A to 3F are sectional views sequentially showing the steps in manufacturing the TFT element according to the first embodiment shown in FIG. 2.

As shown in FIG. 3A, the gate electrode metal film 12 is formed on almost the entire surface of the substrate 11 by a sputtering unit. Note that an aluminum-titanium alloy, Ta, a Ta-Mo alloy, or the like is used as the gate electrode metal film 12.

[Step 2]

Figure 3B:
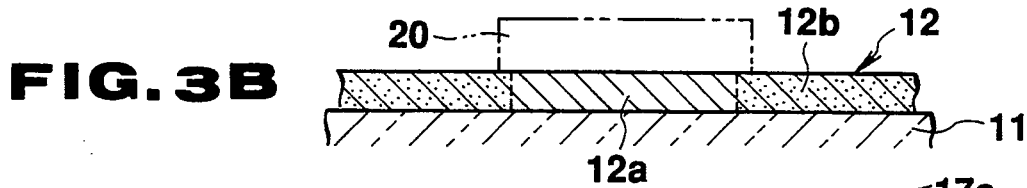
Figure 3C:
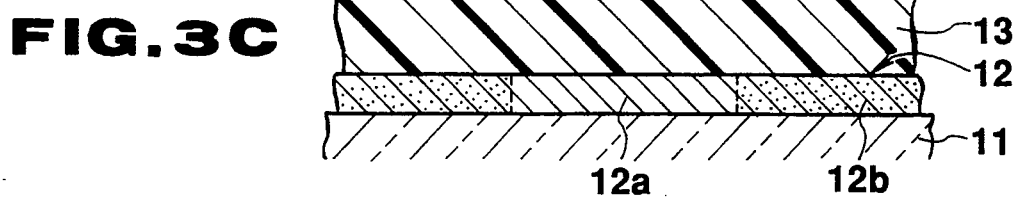

As shown in FIG. 3B, a resist mask 20 is formed on the gate electrode metal film 12 to cover only portions corresponding to the gate electrode 12a and the wiring portion. In this state, the regions of the metal film 12 which are not covered with the resist mask 20 are entirely anodized.

This anodizing process is performed as follows. The substrate 11 and the metal film 12 are dipped into an electrolyte. The metal film 12 is caused to oppose an opposing electrode in the electrolyte, and a voltage is applied between the metal film 12 as an anode and the opposing electrode as a cathode.

When a voltage is applied between the metal film (anode) 12 and the opposing electrode (cathode) in the electrolyte, a chemical reaction of the metal film 12 is caused. As a result, the regions of the metal film 12 which are not covered with the resist mask 20 are anodized from the surface in the direction of film thickness.

In this case, the depth of anodized state of the metal film 12 in the direction of film thickness is mainly determined by the magnitude of an applied voltage. Therefore, if the applied voltage is sufficiently increased, the metal film 12 can be entirely anodized.

When this anodizing process is performed, the portion of the metal film 12 which is covered with the resist mask 20 is not oxidized and is left as a metal film. This portion is formed into the gate electrode 12a and the wiring portion, and the other regions become the oxide insulating layers 12a which are entirely anodized.

Although edge portions of the portion covered with the resist mask 20 are anodized to a certain degree, as shown in FIG. 3B, if the resist mask 20 is formed to have a width slightly larger than that of the gate electrode 12a and the wiring portion, the gate electrode 12a and the wiring portion having desired widths can be left.

[Step 3]

The resist mask 20 is removed from the metal film 12. Thereafter, as show in FIG. 3C, the gate insulating film 13, an i-type semiconductor layer 14a, and a blocking insulating layer 17a are sequentially deposited on the metal film 12 by a plasma CVD unit.

Note that in this embodiment, SiN (silicon nitride) is used for the gate insulating film 13 and the blocking insulating layer 17a, and a-Si (amorphous silicon) is used for the i-type semiconductor layer 14a.

[Step 4]

Figure 3D:
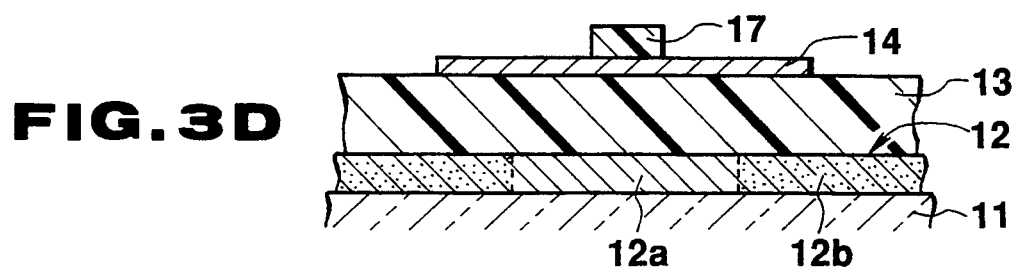

As shown in FIG. 3D, the blocking insulating film 17 is patterned by photolithography to form the layer 17a covering only the channel region of the semiconductor film 14. Furthermore, the i-type semiconductor layer 14a is patterned in a predetermined shape by photolithography to form the film 14.

[Step 5]

Figure 3E:
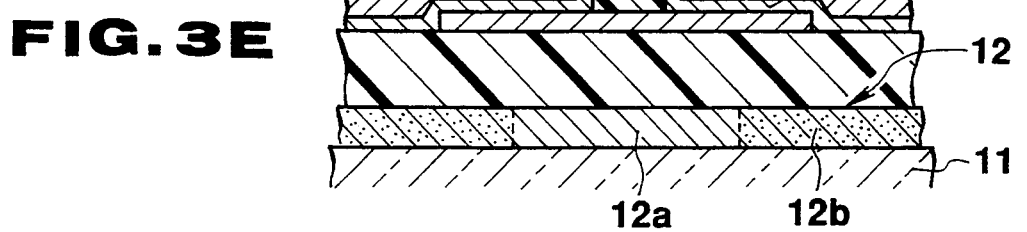

Subsequently, as shown in FIG. 3E, the n-type semiconductor layer 15 is formed by the plasma CVD unit, and a source/drain electrode metal film 16 is deposited on the resultant structure by the sputtering unit.

Note that impurity-doped n-type a-Si is used for the n-type semiconductor layer 15, and Cr or the like exhibiting a good contact property with respect to the n-type semiconductor layer 15 or aluminum or an aluminum-titanium alloy having a low resistance is used for the source/drain electrode metal film 16.

[Step 6]

Figure 3F:
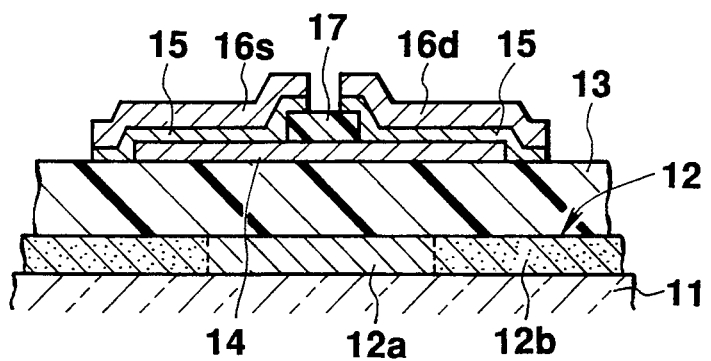

As shown in FIG. 3F, the source/drain electrode metal film is patterned by photolithography to form the source and drain electrodes 16s and 16d and their wiring portions (not shown). In addition, the n-type semiconductor layer 15 is etched to leave portions under the source and drain electrodes 16s and 16d and their wiring portions, thereby completing a thin-film transistor.

That is, in the thin-film transistor of the embodiment described above, the metal film 12 serving as the gate electrode (lower electrode) 12a is not patterned by etching, but the regions, of the metal film 12, other than the portions corresponding to the gate electrode 12a (including the wiring portion of the gate electrode 12a) are entirely anodized, so that the metal film 12 is left, as the oxide insulating layers 12b, around the gate electrode 12a so as not to form stepped portions at the edge portions of the lower electrode. As described above, if the metal film 12 is formed on almost the entire surface of the substrate 11, the entire deposition surface (the upper surface of the metal film 12) for the gate insulating film to be formed in the subsequent step becomes flat without stepped portions.

If the entire deposition surface for the gate insulating film is flat without stepped portions, the gate insulating film 13 can be uniformly deposited on the entire deposition surface to a sufficient thickness, and the breakdown voltage of the gate insulating film 13 can be increased throughout the entire region of the film 13. Therefore, short-circuiting between the gate electrode 12a and the source and drain electrodes 16s and 16d can be reliably prevented.

In the above-described embodiment, the metal film 12 serving as the gate electrode 12a is formed on almost the entire surface of the substrate 11. However, the metal film 12 may be patterned by photolithography. Even in this case, if the metal film 12 is formed on an area covering at least the entire transistor element region, the deposition surface for the gate insulating film 13 to be formed in the subsequent step has no stepped portion within the transistor element region.

If the deposition surface for the gate insulating film 13 is a surface having no stepped portion within at least the entire transistor element region, since the gate insulating film 13 is deposited in the entire transistor element region to a sufficient thickness, the breakdown voltage of the gate insulating film 13 is high throughout the transistor element region. Therefore, no short-circuiting occurs between the gate electrode 12a and the source and drain electrodes 16s and 16d.

The present invention can be applied not only to an inverse stagger type thin-film transistor but also to stagger, coplanar, and inverse coplanar type thin-film transistors.

More specifically, for example, in stagger and coplanar type thin-film transistors, source and drain electrodes as lower electrodes are composed of one metal film having an area corresponding to at least the entire transistor element region, and a region (including a channel portion between the source and drain electrodes) of this metal film other than the electrodes is entirely anodized to be formed into an oxide insulating layer. With this process, after the source and drain electrodes are formed, a gate insulating film can be deposited in the entire transistor element region to a sufficient thickness.

An inverse coplanar type thin-film transistor is only different from the inverse stagger type thin-film transistor of the above embodiment in that the semiconductor film 14, the n-type semiconductor layer 15, and the source and drain electrodes 16s and 16d are stacked in a reverse order. Therefore, in the inverse coplanar type thin-film transistor, similar to the above embodiment, a gate electrode as a lower electrode is composed of a metal film having an area corresponding to at least the entire transistor element region, and regions of this metal film other than the portion serving as the electrode (including a wiring portion if the wiring portion of the lower electrode is to be composed of the metal film) are entirely anodized to be formed into oxide insulating layers.

The above-mentioned anodizing process of the entire metal film in the direction of film thickness is performed in the following manner.

An anodizing method in which a film to be oxidized is a conductive metal film consisting of aluminum (to be referred to as Al hereinafter) or an aluminum-titanium alloy will be described first. This Al film is anodized by an anodizing unit shown in FIG. 4 as follows. An insulating substrate (e.g., a glass substrate) 111 on which an Al film as a film 112 to be oxidized is formed is dipped into an electrolyte 113 filled in an electrolyte bath 110, and a voltage is applied between the Al film 112 and a cathode 114 consisting of platinum or the like from a DC power supply 116 through a connection member 115.

A voltage 1.3 or more times a reference voltage obtained by dividing the thickness of the Al film by an oxidation progress depth per unit voltage is applied between the Al film and the cathode.

The reference voltage is an calculated voltage required to oxide the Al film to a depth equal to its thickness. The voltage applied between the Al film and the cathode is a voltage higher than the reference voltage.

The following are examples of anodizing conditions for the Al film, provided that the film has a thickness of 100 nm:

applied voltage: 100V or more
current density: 0.5 to 2 mA/cm$^2$

Note that the electrolyte is a citric acid solution having an electrolyte concentration of 0.01 to 0.05 wt %.

When the Al film is anodized by using the above electrolyte, the oxidation progress depth per unit voltage is 1.3 to 1.4 mm/V. The voltage 1.3 or more times the reference voltage {(100/(1.3 to 1.4 V))} obtained by dividing the thickness (100 nm) of the Al film by the oxidation progress depth is about 100 V or more.

If the voltage applied between the Al film and the cathode is 1.3 or more times the reference voltage obtained by dividing the thickness of the Al film by the oxidation progress depth per unit voltage, the apparent maximum progress depth (based on the assumption that the Al has a thickness larger than an actual thickness) of an oxide layer ($Al_2O_3$ layer) formed from the surface of the Al film in the direction of film thickness exceeds the actual thickness of the Al film, thus oxidizing the entire Al film.

Figure 5A:
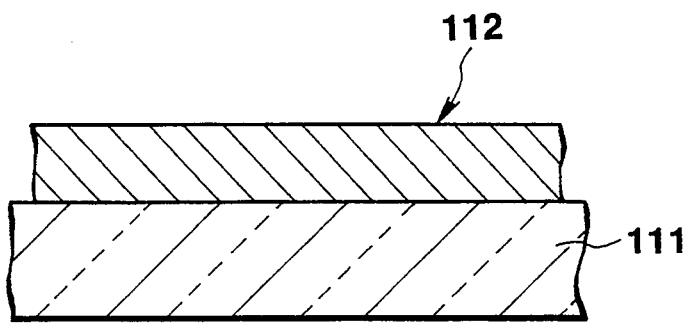
FIGS. 5A and 5B are sectional views showing the process of forming an oxide film by anodizing a metal film using the anodizing unit in FIG. 4.
Figure 5B:
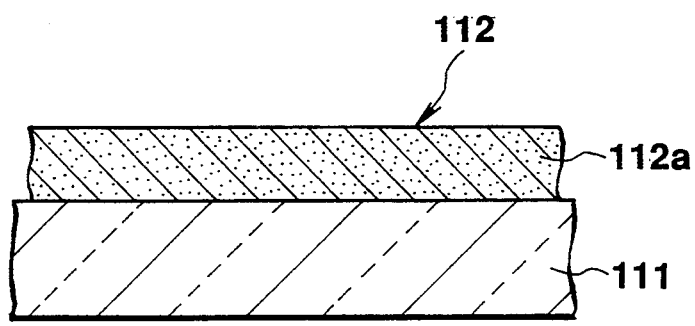

FIGS. 5A and 5B respectively show a pre-anodized state of the film 112 to be oxidized, which is formed on the substrate 111, and a state of the same film anodized by the above-described anodizing method.

As shown in FIGS. 5A and 5B, the film 112 is formed into an oxide film 112a.

According to the above-described anodizing method, therefore, the film 112 to be oxidized can be entirely oxidized to obtain an insulating film which is entirely composed of an insulating layer.

In the above embodiment, the applied voltage is set to be 1.3 or more times the reference voltage for the following reason. If the applied voltage is less than 1.3 times the reference voltage, a lower layer of the film to be oxidized may be left as a conductive layer (Al layer) which is not oxidized, although it might be very thin. In contrast to this, if the applied voltage is set to be 1.3 or more the reference voltage as in the embodiment, the entire Al film as the film to be oxidized can be reliably oxidized.

If, however, the applied voltage is set to be too high, the insulating film ($Al_2O_3$ film) obtained by anodizing the Al film is subjected to breakdown. Therefore, the applied voltage is preferably set to be about 400 V or less.

In addition, according to the above embodiment, a citric acid solution is used as an electrolyte. However, an ammonium borate solution or the like may be used as an electrolyte used for anodizing the Al film.

Furthermore, in the above embodiment, the thickness of the Al film is set to be 100 nm. However, since the applied voltage can be increased to about 400 V, the above-described anodizing method can be applied to an anodizing process of an Al film having a thickness of about 400 nm.

If, for example, an Al film having a thickness of 400 nm is to be anodized by using an ammonium borate solution having an electrolyte concentration of 0.01 to 3.0 wt % as an electrolyte, the applied voltage is set to be 400 V (current density: 0.5 to 2 mA/cm$^2$).

An anodizing method in which a film to be oxidized is a conductive metal film consisting of tantalum (to be referred to as Ta hereinafter) will be described next. This Ta film is also anodized by the anodizing unit shown in FIG. 4.

When a film to be oxidized is a Ta film, a voltage 1.7 or more times a reference voltage obtained by dividing the thickness of the Ta film by an oxidation progress depth per unit voltage is applied between the Ta film and the cathode, thereby oxidizing the Ta film.

The following are examples of anodizing conditions for the Ta film, provided that the film has a thickness of 100 nm:

applied voltage: 100 V or more
current density: 0.5 to 2 mA/cm$^2$

Note that the same electrolyte as that used for the anodizing process of the Al film, i.e., a citric acid solution having an electrolyte concentration of 0.01 to 0.05 wt % is used.

When the Ta film is anodized by using the above-mentioned electrolyte, the oxidation progress depth per unit voltage is 1.7 nm/V. The voltage 1.7 times the reference voltage (100/1.7 V) obtained by dividing the thickness (100 nm) of the Ta film by this oxidation progress depth is 100 V or more.

If the voltage applied between the Ta film and the cathode is 1.7 or more times the reference voltage obtained by dividing the thickness of the Ta film by the oxidation progress depth per unit voltage, the apparent maximum progress depth of an oxide layer ($TaO_x$ layer) formed from the surface of the Al film in the direction of film thickness exceeds the actual thickness of the Al film, thus oxidizing the entire Ta film, as shown in FIG. 5B.

According to this anodizing method, therefore, the Ta film can be entirely oxidized to obtain an insulating film ($TaO_x$ film) which is entirely composed of an insulating layer.

In the above embodiment, if the applied voltage is less than 1.7 times the reference voltage, a very thin lower layer of the oxidation film may be left as a conductive layer (Ta layer) which is not oxidized. In contrast to this, if the applied voltage is set to be 1.7 or more the reference voltage, the entire Ta film as the film to be oxidized can be reliably oxidized.

An ammonium borate solution or the like may be used as an electrolyte used for the anodizing process of the Ta film.

In addition, it is preferable that the applied voltage be limited to the allowable voltage (about 400 V) or less within which breakdown of the insulating film ($TaO_x$ film) obtained by anodizing the Ta film does not occur. Therefore, a thicker Ta film can be anodized within this range, although some limitations are imposed on the thickness of a Ta film as a film to be oxidized. According to the above-described anodizing method, a Ta film having a thickness up to about 400 nm can be entirely anodized.

For example, when a Ta film having a thickness of 400 nm is to be anodized by using an ammonium borate solution having an electrolyte concentration of 0.1 to 3.0 wt % as an electrolyte, the applied voltage is set to be 400 V (current density: 0.5 to 2 mA/cm²).

Figure 4:
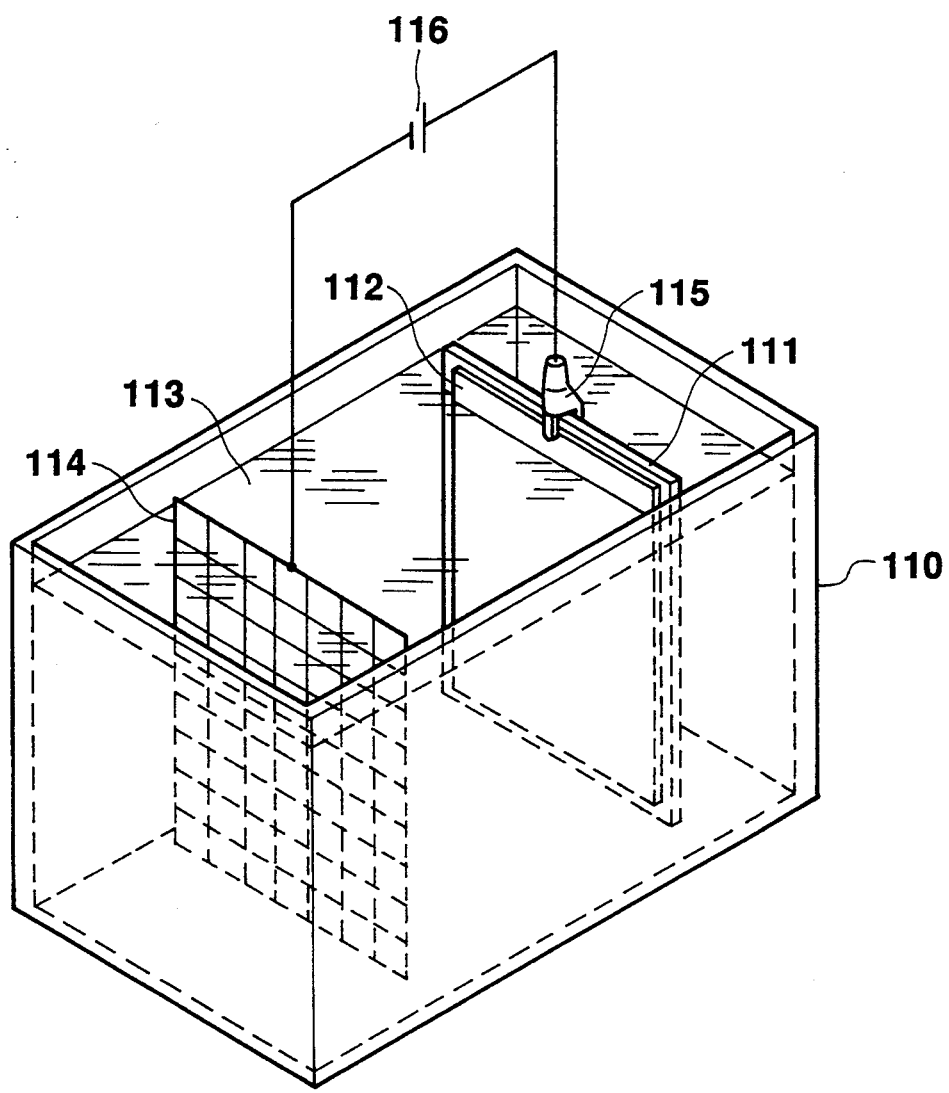
FIG. 4 is a perspective view showing the schematic arrangement of an anodizing unit used in the process of manufacturing the TFT element of the present invention.
Figure 6:
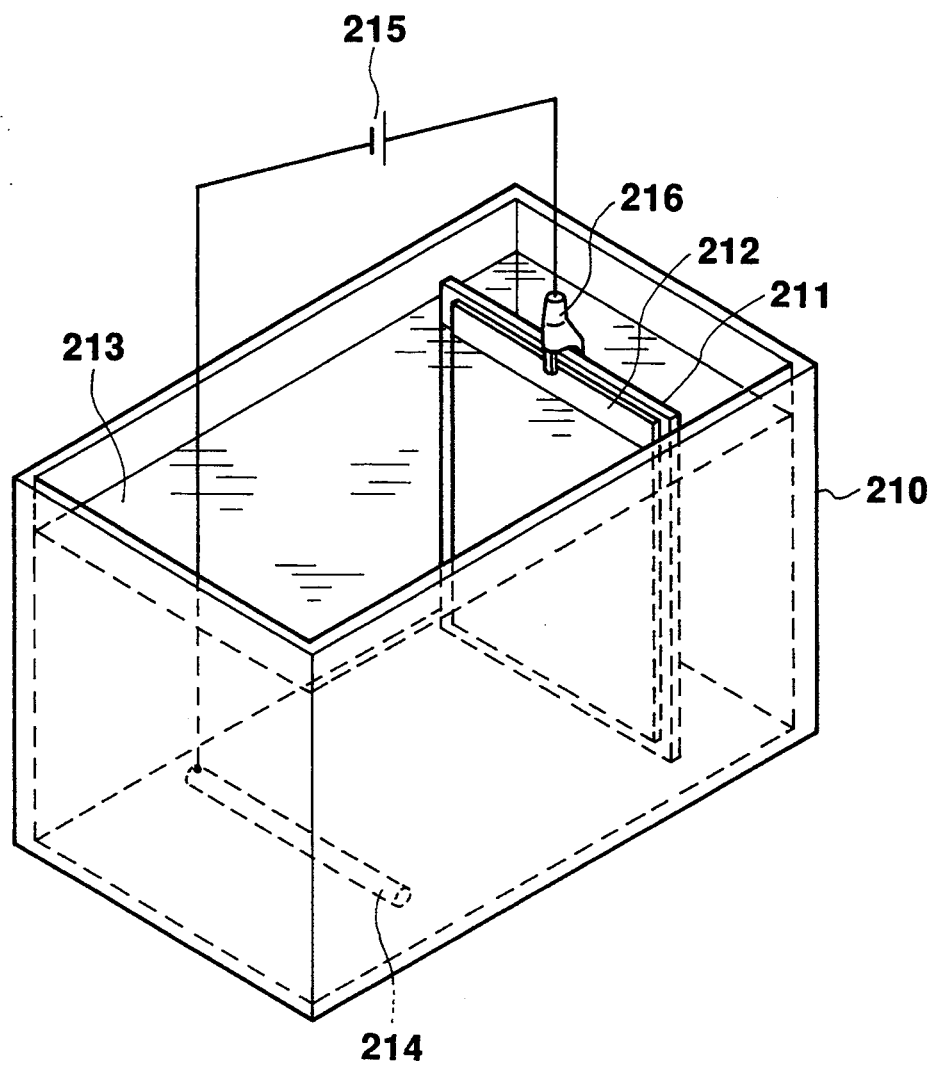
FIG. 6 is a perspective view showing the schematic arrangement of an anodizing unit different from the one shown in FIG. 4, which is used in the process of manufacturing the TFT element of the present invention.

When a metal film is anodized by using the anodizing unit shown in FIG. 4, since the oxidation progress rate varies locally, uniform oxidation progress thickness may not be achieved sometimes. In order to solve this problem, an anodizing unit shown in FIG. 6 is used. More specifically, this anodizing unit comprises an electrolyte bath 210 filled with an electrolyte 213, a cathode 214 horizontally dipped in the electrolyte 213, a DC power supply 215, and a connection member 216 for applying a voltage from the DC power supply 215 to a film 212 to be oxidized, which is formed on a substrate 211.

The cathode 214 is constituted by a rod-like electrode consisting of platinum or the like. The cathode 214 is horizontally arranged near the bottom of the electrolyte bath 210 and is connected to one pole of the DC power supply 215.

The film 212 to be oxidized is anodized by this anodizing unit in the following manner. As shown in FIG. 6, the substrate 211 on which the film 212 is formed is vertically dipped into the electrolyte 213 such that the upper end portion of the substrate 211 and the upper end portion of the film 212 protrude from the electrolyte surface. The DC power supply 215 then applies a voltage between the upper end portion of the film 212 and the cathode 214, thus applying the voltage between the film 212 and the cathode 214.

The film 212 is a metal film, e.g., an aluminum or tantalum film. A voltage is applied to the film 212 through the clip type connection member 216 held on the upper end portion of the substrate 211. The value of the voltage to be applied to the upper end of the film 212 is set, in consideration of a voltage drop due to the resistance of the film 212 itself, such that the voltage is also applied to the lower end portion of the film 212 so as to entirely anodize the film 212.

When such a voltage is applied between the film 212 and the cathode 214, a chemical reaction is caused in a target region of the film 212 which is dipped in the electrolyte 213, and the region is anodized from its surface.

In this anodizing unit, since the cathode 214 has a rod-like shape and is arranged near the bottom of the electrolyte bath 210, the distance between the cathode 214 and the film 212 is increased toward the voltage application place on the upper end side of the film 212 at which the voltage is applied. Therefore, the resistance between the cathode 214 and the film 212 is decreased with a decrease in distance therebetween, i.e., toward the lower end portion opposite to the voltage application place, and is increased toward the voltage application place.

Consequently, the resistance of a current path reaching the voltage application place through the respective portions of the cathode 214 and the film 212 is slightly decreased at the lower end side of the film 212, thus applying an almost uniform voltage to the respective portions of the film 212.

The oxidation depth and progress rate of the film 212 in the direction of film thickness are mainly determined by a voltage applied between the film 212 and the cathode 214. Since this voltage is increased at the lower end of the film in the voltage distribution, as described above, the target region of the film 212 is oxidized from its lower end to be almost uniformly oxidized throughout the region.

Figure 7A:
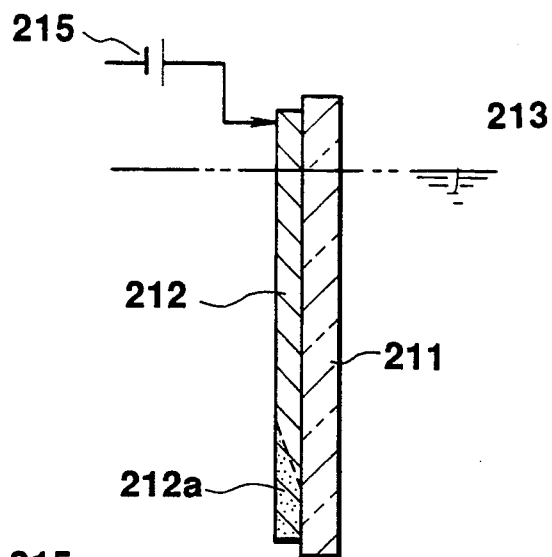
FIGS. 7A to 7C are sectional views showing the process of forming an oxide film by anodizing a metal film using the anodizing unit shown in FIG. 6.
Figure 7B:
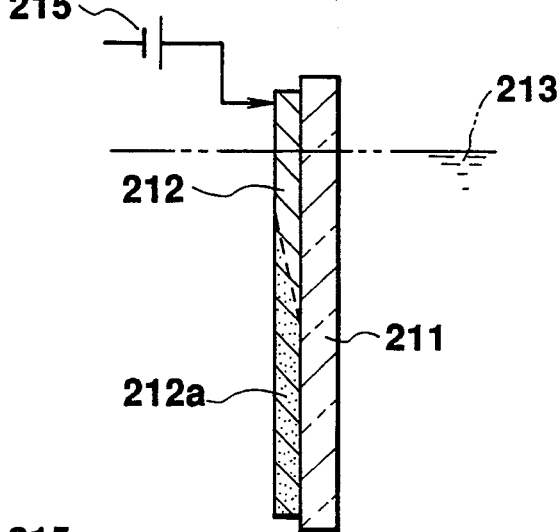
Figure 7C:
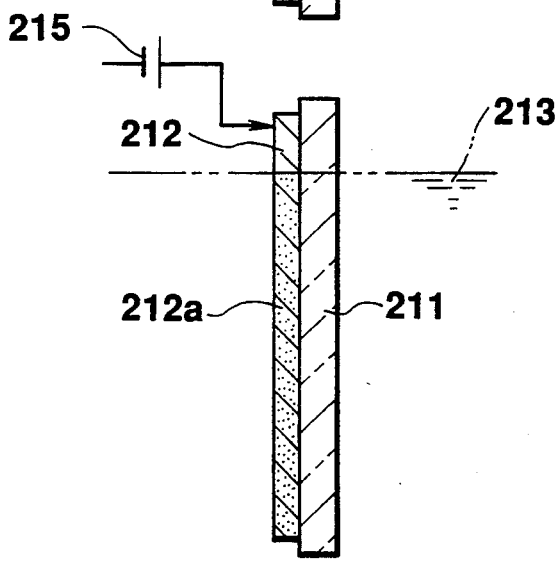

FIGS. 7A, 7B, and 7C show an oxidation progress state of the film 212 when the film 212 is anodized by the above-described anodizing unit. FIG. 7A shows an initial oxidation state. FIG. 7B shows certain progress of oxidation. FIG. 7C shows a state at the end of oxidation.

Referring to FIGS. 7A to 7C, reference numeral 212a denotes an oxide layer obtained by anodizing the film 212 to be oxidized. As shown in FIGS. 7A to 7C, the oxide layer 212a extends from the lower end of the film 212 to the upper end. Finally, the target region of the film 212 which is dipped into the electrolyte 213 is entirely formed into the oxide layer 212a.

According to the above-described anodizing unit, therefore, since the entire target region of the film 212 can be almost uniformly oxidized, even if the film 212 has a large area, the target region can be entirely oxidized.

In the above-described anodizing unit, the cathode 214 has a rod-like electrode and is arranged near the bottom of the electrolyte bath 210. However, the cathode may be constituted by an electrode which opposes the entire surface of the film 212 to be oxidized, e.g., a net electrode used in a conventional anodizing unit. In such a case, if the cathode is inclined such that its upper end side is separated from the film 212, since the distance between the cathode and the film 212 is increased toward the voltage application place on the upper end side of the film 212, the same anodizing process as that in the above-described embodiment can be performed.

As is apparent from the description of the anodizing unit shown in FIG. 4, the problem of nonuniform anodizing depth can also be solved by the following method.

Figure 8:
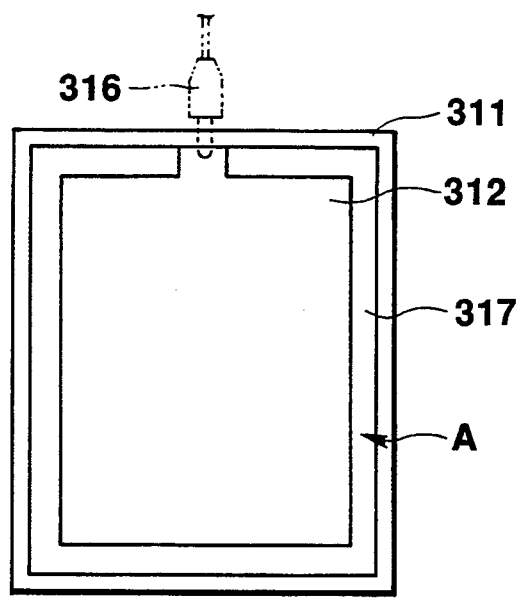
FIG. 8 is a plan view showing a substrate on which a metal film to be oxidized is formed, and which is applied to an anodizing method in the process of manufacturing the TFT element of the present invention.
Figure 9:
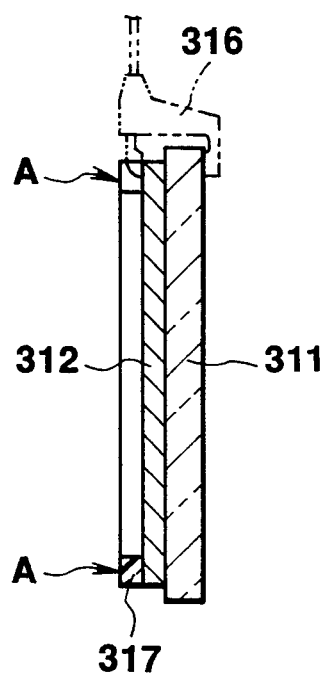
FIG. 9 is a sectional view showing a substrate in FIG. 8.

In this anodizing method, the surface of a peripheral portion surrounding a target region of a conductive film 312 to be oxidized formed on a substrate 311 is covered with an insulating film 317 such as a photoresist film, and the target region of the conductive film 312 is anodized by the above-described anodizing unit. The insulating film 317 is formed on the entire peripheral portion of the conductive film 312 except for a voltage application place with which a connection member 316 comes into contact, as shown in FIGS. 8 and 9.

Figure 10:
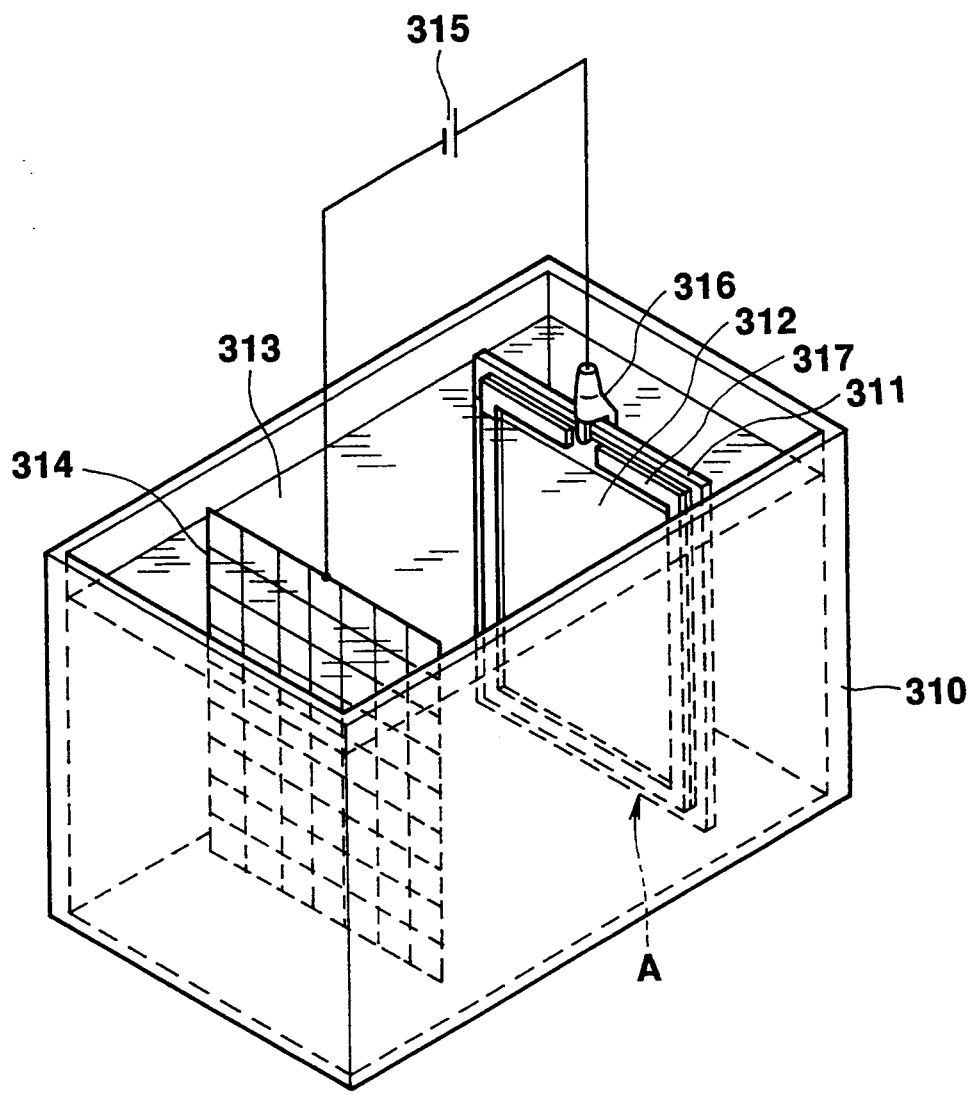
FIG. 10 is a perspective view showing a state of the anodizing process of the substrate shown in FIG. 8.

The conductive film 312 to be oxidized is a metal film such as an aluminum, aluminum-titanium alloy, or tantalum film. This conductive film 312 is anodized in the following manner. As shown in FIG. 10, the substrate 311 on which the conductive film 312 is formed is dipped into an electrolyte 313 filled in an electrolyte bath 310 such that the upper end portions of the substrate 311 and the conductive film 312 protrude from the electrolyte surface. Thereafter, a voltage is applied from a DC power supply 315 to the upper portion of the conductive film 312 and a cathode 314, thus applying the voltage between the conductive film 312 and the cathode 314.

When the voltage is applied between the conductive film 312 and the cathode 314, a chemical reaction is caused in the portion of the conductive film 312 which is dipped in the electrolyte 313. As a result, the portion is anodized from its surface.

In this case, the conductive film 312 is anodized in such a manner that the anodizing rate is increased toward the upper end portion, of the portion dipped in the electrolyte 313, located near the voltage application place (in contact with the connection member 316). That is, the anodizing rate is increased toward the portion to which a high voltage is applied. Therefore, of the target region of the conductive film 312, the portion near the voltage application place is increased in resistance with the progress of the anodizing process.

In this anodizing method, however, since the surface of the peripheral portion surrounding the target region of the conductive film 312 is covered with the insulating film 317, the covered portion is not anodized. Therefore, the peripheral portion of the conductive film 312 is always kept conductive.

For this reason, even if the upper end portion, of the target region of the conductive film 312, which is located near the voltage application place is increased in resistance with the progress of the anodizing process, the voltage applied to the voltage application place is applied to the target region of the conductive film 312 from its peripheral portion through the non-oxidized portion of the conductive film peripheral portion.

That is, in the above-described anodizing method, the surface of the peripheral portion surrounding the target region of the conductive film 312 is covered with the insulating film 317, and the voltage applied to the upper end portion of the conductive film 312 is applied to the target region of the conductive film 312 through a current path A constituted by the conductive film peripheral portion covered with the insulating film 317.

According to this anodizing method, even if the upper and portion, of the target region of the conductive film 312, located near the voltage application place is increased in resistance with the progress of the anodizing process, since the voltage applied to the voltage application place is applied to the target region of the conductive film 312 from its peripheral portion through the current path A constituted by the conductive film peripheral portion, a sufficiently high voltage (which only undergoes a voltage drop in the current path A) can be kept applied to the part of the target region in which the anodizing rate is low. Consequently, the entire target region of the conductive film 312 is almost uniformly anodized.

Figure 11A:
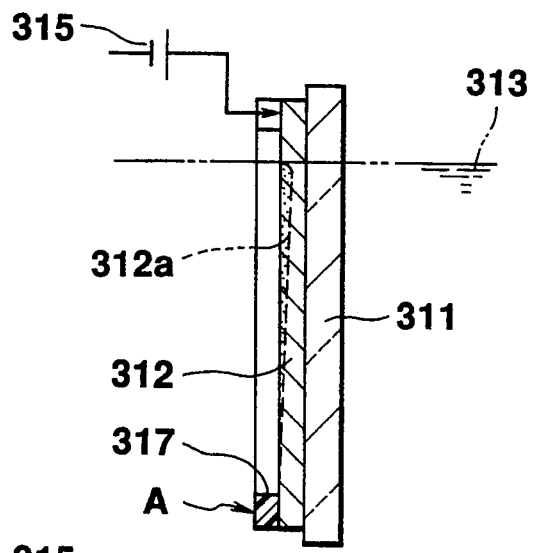
FIGS. 11A to 11C are sectional views showing the process of forming an oxide film by anodizing a metal film on the substrate shown in FIG. 8.
Figure 11B:
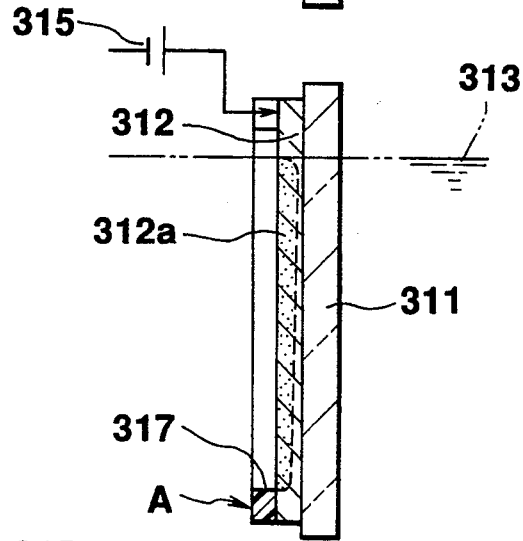
Figure 11C:
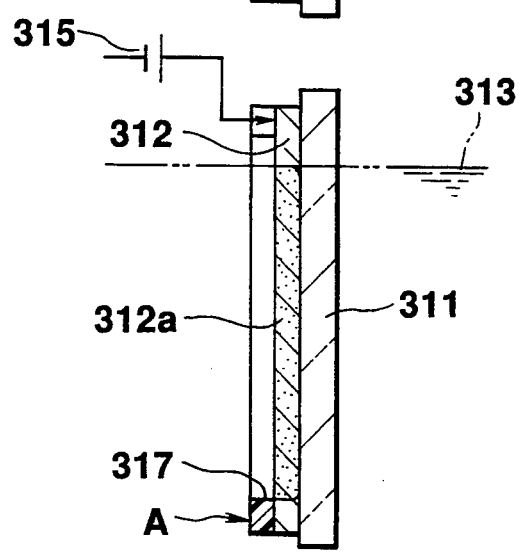

FIGS. 11A, 11B, and 11C show an oxidation progress state of the conductive film 312 when the conductive film 312 is anodized by the above-described anodizing method. FIG. 11A shows an initial oxidation state. FIG. 11B shows certain progress of oxidation. FIG. 11C shows a state at the end of oxidation.

Even if the resistance of the upper end portion is increased with the progress of the anodizing process, since the voltage applied to the voltage application place is applied to the target region of the conductive film 312 from its peripheral portion through the current path A, as shown in FIG. 11A, the entire target region is almost uniformly oxidized, as shown in FIG. 11B. Finally, the entire region is oxidized, as shown in FIG. 11C.

As described above, according to this anodizing method, since the entire target region of the conductive film 312 can be almost uniformly oxidized, even if the conductive film 312 has a large area, the target region can be entirely oxidized in the direction of thickness.

The anodizing process of the conductive film 312 is performed in such a manner that, of the region dipped in the electrolyte 313, only the region which is not covered with the insulating film 317 is anodized, but the current path portion covered with the insulating film 317 and the upper end portion protruding from the electrolyte surface are not oxidized. For this reason, the non-oxidized portion remains as a conductive film. However, this conductive film portion may be used as a conductive film or removed by etching in the subsequent step, as needed.

In the above-described anodizing method, a voltage is applied through one specific place of the upper end portion of the outer peripheral portion of the conductive film 312. However, connection members 316 may be brought into contact with a plurality of places of the peripheral portion of the conductive film 312 so that application of a voltage to the conductive film 312 can be performed through the plurality of places.

In addition, according to the above-described embodiment, the conductive film 312 is dipped into the electrolyte 313 except for its upper end portion. However, the conductive film 312 may be entirely dipped into the electrolyte 313. In this case, the voltage application place is covered with an insulating coating through the connection member 316.

Furthermore, the above-described anodizing method can be applied to an anodizing process of a conductive film, e.g., an n- or p-type silicon semiconductor film as well as a metal film. A silicon semiconductor film is anodized by applying a voltage between the silicon semiconductor film dipped in the electrolyte and the cathode, and radiating light onto the film.

Another method of solving the problem of a nonuniform anodizing process will be described below with reference to 12 to 14C.

In this anodizing method, instead of covering the surface of the peripheral portion of the conductive film with the insulating film as in the above-described method, the thickness of the peripheral portion surrounding the target region of the conductive film is increased, and the thick portion is used as a current path A. The conductive film is anodized by the anodizing unit shown in FIG. 4.

Figure 12:
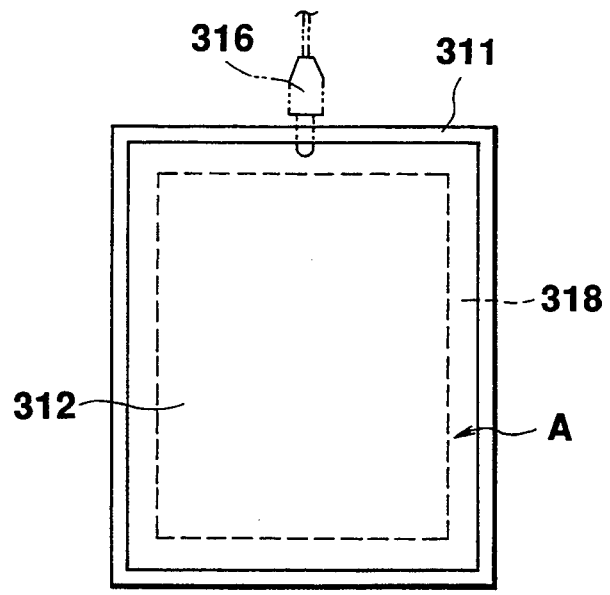
FIG. 12 is a plan view showing a substrate, different from the one shown in FIG. 8, on which a metal film to be oxidized is formed, and which is applied to an anodizing method in the process of manufacturing the TFT element of the present invention.
Figure 13:
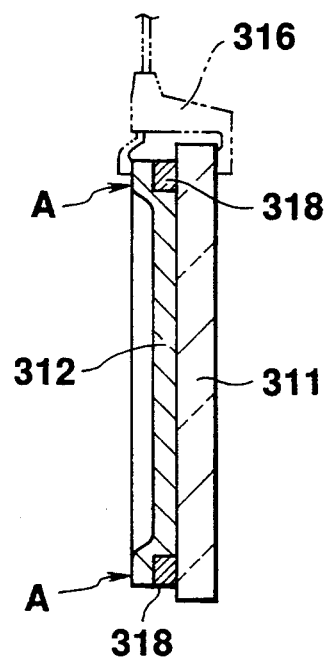
FIG. 13 is a sectional view of the substrate shown in FIG. 12.

FIGS. 12 and 13 show a conductive film 312 formed on an insulating substrate 311. The conductive film 312 is a metal film consisting of aluminum, tantalum, or the like. The peripheral portion of the conductive film 312 is formed into a two-layer thick film constituted by a frame-like conductive film 318 formed throughout the conductive film peripheral portion, and the central conductive film.

The frame-like conductive film 318 is composed of the same metal material as that for the central conductive film to be anodized or a low-resistance metal. The thickness of the frame-like conductive film 318 is set to be equal to or larger than that of the conductive film 312 to be oxidized.

The conductive film 312 is anodized in the same manner as described with reference to FIG. 10. That is, the substrate 311 on which the conductive film 312 is formed is vertically dipped into the electrolyte 313 with the upper end portions of the substrate 311 and the conductive film 312 protruding from the electrolyte surface, and a voltage is applied between the upper end of the conductive film 313 and the cathode.

In this anodizing method, the thickness of the peripheral portion surrounding the target region of the conductive film 312 is increased, and the voltage applied from the DC power supply to the upper end portion of the conductive film 312 through the connection member 316 is applied to the target region of the conductive film 312 through the current path A constituted by the thick film portion of the conductive film peripheral portion.

Similar to the above-described method, in this anodizing method, a sufficiently high voltage can be kept applied from the peripheral portion to part of the target region of the conductive film 312 in which the anodizing rate is low thereby almost uniformly anodizing the entire target region of the conductive film 312.

Figure 14A:
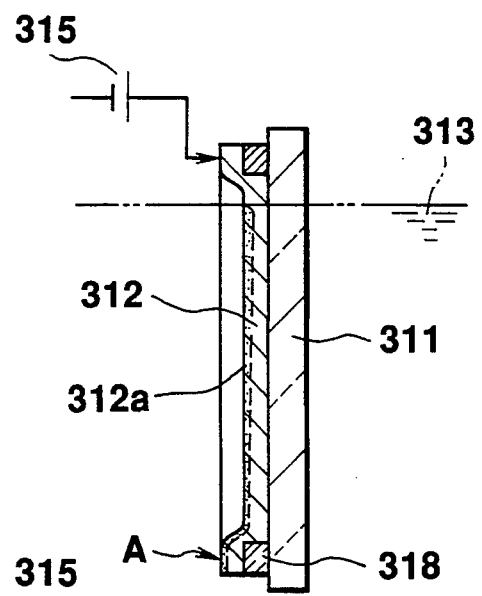
FIGS. 14A to 14C are sectional views showing the process of forming an oxide film by anodizing a metal film on the substrate shown in FIG. 12.
Figure 14B:
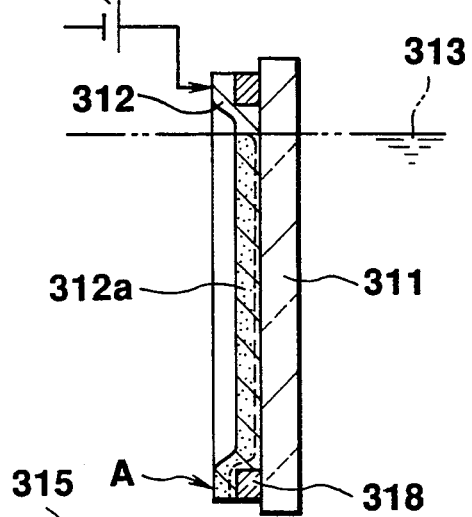
Figure 14C:
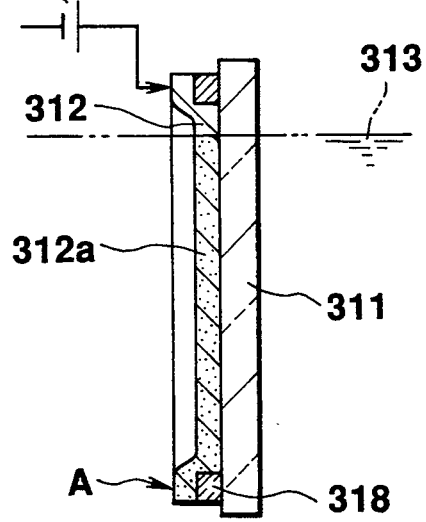

FIGS. 14A, 14B, and 14C show an oxidation progress state of the conductive film 312 when the conductive film 312 is anodized by the above-described anodizing method. FIG. 14A shows an initial oxidation state. FIG. 14B shows certain progress of oxidation. FIG. 14C shows a state at the end of oxidation.

Similarly, in this anodizing method, as shown in FIG. 14A, the anodizing rate is increased toward the upper end portion of the conductive film which is located near the voltage application place.

Note that since the current path A of the conductive film peripheral portion is thick, it has a low resistance, and a voltage drop therein is small. Therefore, the voltage applied to the voltage application place is applied to the target region of the conductive film 312 from its peripheral portion through the current path A.

For this reason, the difference in anodizing rate between the near side (upper end side) close to the voltage application place and the remote side (lower end side) is reduced.

Furthermore, in this case, although the current path A of the peripheral portion of the conductive film 312 is also anodized from its surface side together with the target region of the conductive film 312, only the surface layer is anodized with the lower layer remaining as a metal layer because the current path A is thick. Therefore, the current path A is always kept conductive.

Consequently, oxidation proceeds almost uniformly throughout the target region of the conductive film 312. Finally, the target region is entirely oxidized, as shown in FIG. 14C.

According to the above-described anodizing method, since the entire target region of the conductive film 312 can be almost uniformly oxidized, even if the conductive film 312 has a large area, the entire region can be oxidized in the direction of thickness to obtain a uniform insulating film.

Figure 15:
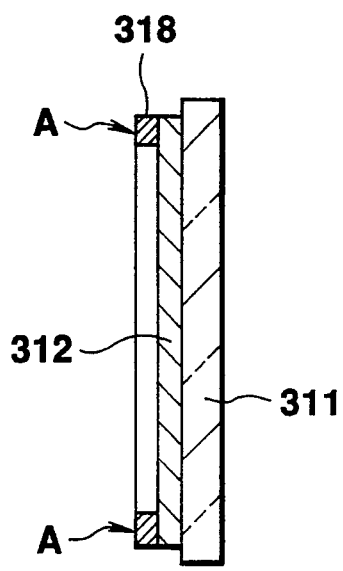
FIG. 15 is a sectional view showing a substrate, different from the one shown in FIG. 13, on which a metal film to be oxidized is formed, and which is applied to an anodizing method in the process of manufacturing the TFT element of the present invention.

In addition, according to the anodizing method, the frame-like conductive film 318 is formed on the substrate surface side of the peripheral portion of the conductive film 312 to be oxidized to form the conductive film peripheral portion into the thick current path A. However, the frame-like conductive film 318 may be formed on the upper layer of the peripheral portion of the conductive film 312, as shown in FIG. 15.

Figure 16:
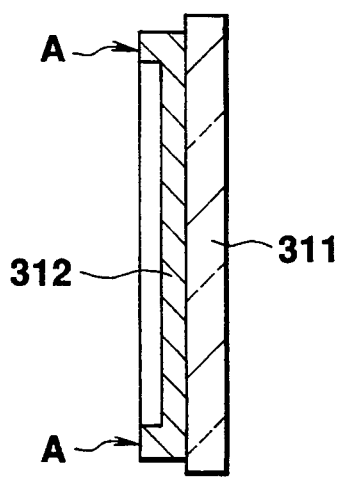
FIG. 16 is a sectional view of a substrate on which different metal film from that shown in FIG. 15 is formed.

Furthermore, the current path A may be constituted by a single layer, as shown in FIG. 16. In this case, the conductive film is formed thick, and the target region excluding the peripheral portion is etched to a predetermined thickness, thereby forming the thick film portion left on the peripheral portion into the current path A.

[Second Embodiment]

In the second embodiment of the present invention, source and drain electrodes are not separated from each other in a channel region by etching, but are electrically separated from each other in the following manner. Source and drain electrodes are formed from a continuous metal film first. The region between the source and drain electrode portions of the metal film is entirely anodized to electrically separate the source and drain electrodes from each other, thereby reducing the steps between the source and drain electrodes and the portion therebetween.

The second embodiment of the present invention will be described below with reference to FIGS. 17 to 18F.

Figure 17:
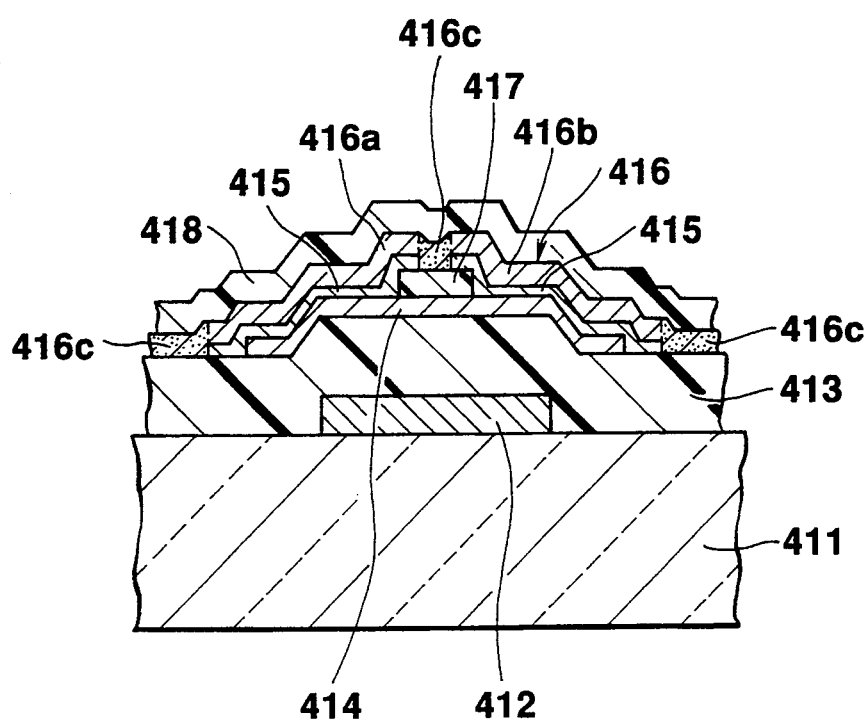
FIG. 17 is a sectional view showing the structure of a TFT element according to the second embodiment of the present invention.

FIG. 17 is a sectional view showing a thin-film transistor of this embodiment. This thin-film transistor comprises a gate electrode 412 formed on an insulating substrate 411 consisting of glass, a gate insulating film 413 covering the gate electrode 412, a semiconductor film 414 formed on the gate insulating film 413 to oppose the gate electrode 412, and source and drain electrodes 416a and 416b formed on the two sides of the semiconductor film 414 through ohmic contact layers, each consisting of an n-type semiconductor layer 415. Reference numeral 417 denotes a blocking insulating film formed on the channel region of the semiconductor film 414.

The source and drain electrodes 416a and 416b and their lead portions (not shown) are formed from a continuous metal film 416. The region between the source electrode 416a portion and the drain electrode 416b portion of the metal film 416 is entirely anodized to be formed into an oxide insulating layer 416c.

This metal film 416 is formed on almost the entire surface of the substrate 411, and portions of the metal film 416 other than the source and drain electrode portions and the lead portions are entirely anodized to be formed into oxide insulating layers 416c.

Note that the n-type semiconductor layers 415 are formed only under the source and rain electrodes 416a and 416b of the metal film 416. These n-type semiconductor layers 415 are separated from each other by the channel region.

The upper portion of the thin-film transistor is covered with a protective insulating film 418, and other electrodes (e.g., a pixel electrode) to be formed on the substrate 411 on which the thin-film transistor is formed are formed on the protective insulating film 418.

FIGS. 18A to 18F show the steps of a method of manufacturing the thin-film transistor described above. This thin-film transistor is manufactured in the following steps.

[Step 1]

Figure 18A:
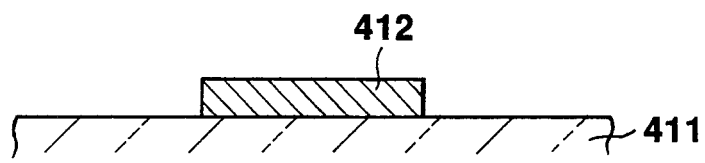
FIGS. 18A to 18F are sectional views sequentially showing the steps in manufacturing the TFT element of he second embodiment of the present invention shown in FIG. 17.

As shown in FIG. 18A, the gate electrode 412 is formed on the substrate 411 first. The gate electrode 412 is formed in such a manner that a metal film consisting of Ta (tantalum), Ta-Mo (tantalum-molybdenum alloy), Cr (chromium), an Al alloy, or the like is formed on the substrate 411 by a sputtering unit, and the metal film is patterned.

The gate electrode 412 may be composed of an Al (aluminum) material containing Ti (titanium).

The Ti-containing Al material is used for the gate electrode for the following reason. A hard metal such as Ta (tantalum), Ta-Mo (tantalum-molybdenum alloy), or Cr (chromium) generally used as an electrode material for a thin-film transistor has a high resistance. In contrast to this, Al, a typical low-resistance metal, has a low resistance. However, if an Al film is heat-treated at several hundreds degrees centigrade, its surface is coarsened. Although the above-mentioned Ti-containing Al material has a resistance slightly higher than that of pure Al, its resistance is much lower than that of the above-mentioned hard metal, and the film surface is not coarsened by heat treatment.

[Step 2]

Figure 18B:
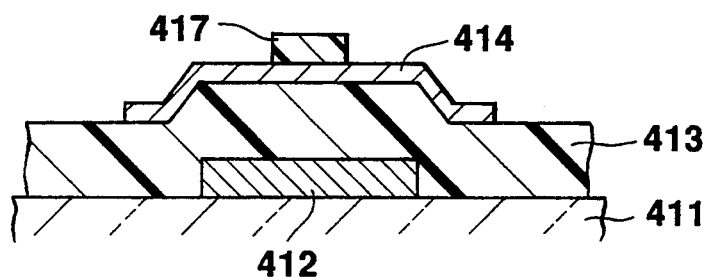

As shown in FIG. 18B, the gate insulating film 413, the semiconductor film 414, and the blocking insulating film 417 are sequentially formed on the substrate 411.

The gate insulating film 413 is formed by depositing SiN (silicon nitride) on almost the entire surface of the substrate 411 by a plasma CVD unit.

The semiconductor film 414 and the blocking insulating film 417 are formed as follows. Upon formation of the gate insulating film 413, i-type a-Si (amorphous silicon) and SiN films are sequentially deposited on the resultant structure by the plasma CVD unit. The SiN film is then patterned into the blocking insulating film 417, while the i-type a-Si film is patterned into the semiconductor film 414.

Assume that the gate electrode 412 is composed of Al. In this case, when the gate insulating film 413 is formed, the gate electrode (Al film) is heated at the film formation temperature of the gate insulating film 413 (normally, 350° to 370° C.), and its surface is coarsened, thus forming acute projections called hillocks on the surface of the gate electrode. As a result, defects such as cracks are caused in the gate insulating film 412.

In this embodiment, however, since the gate electrode is not composed of pure Al but is composed of the Ti-containing Al material, i.e., an Al material containing Ti, the surface of the gate insulating electrode (Ti-containing Al film) 412 is not coarsened upon formation of the gate insulating film 413. Therefore, no defects such as cracks are caused in the gate insulating film 413. Note that the film formation temperature of the semiconductor film (i-type a-Si film) 414 is about 250° C., and the film formation temperature of the blocking insulating film (SiN film) 417 is the same as that of the gate insulating film 413. Therefore, if the content of Ti in the Ti-containing Al material is selected in accordance with the film formation temperature of the gate insulating film 413, which is free from surface coarsening (about 4.2 wt % when the film formation temperature of the gate insulating film 413 is 350° to 370° C.), the surface of the gate electrode 412 is not coarsened upon formation of either the semiconductor film 414 or the blocking insulating film 417.

[Step 3]

Figure 18C:
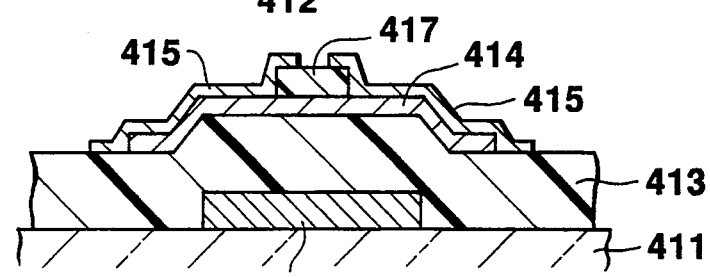

Subsequently, as shown in FIG. 18C, the n-type semiconductor layer 415 is formed. This n-type semiconductor layer 415 is formed as follows. An impurity-doped n-type a-Si film is formed first by the plasma CVD unit. This n-type a-Si film is patterned into source and drain electrode portions with the two portions separated from each other by the channel region.

[Step 4]

Figure 18D:
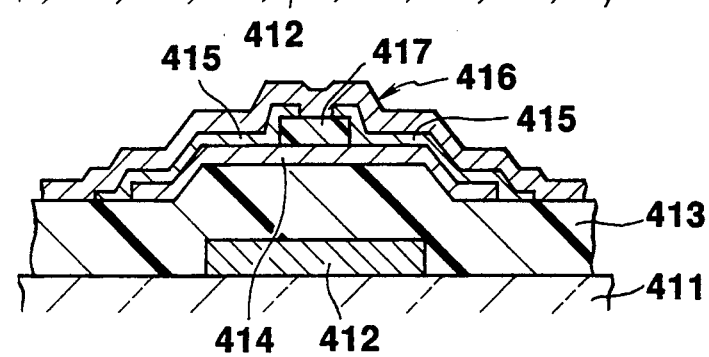

As shown in FIG. 18D, the source/drain electrode metal film 416 is deposited on almost the entire surface of the substrate 411 by the sputtering unit. This metal film 416 is composed of a Ti-containing Al material having the same Ti content as that of the material for the gate electrode 412.

[Step 5]

Figure 18E:
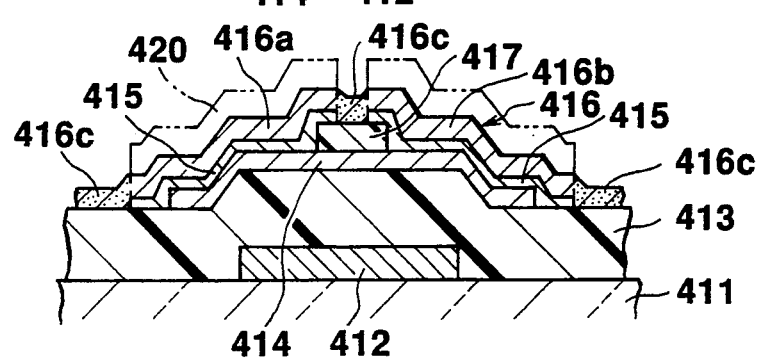

As shown in FIG. 18E, the source and drain electrodes 416a and 416b and a resist mask 420 having a shape corresponding to the lead portions of electrodes are formed on the metal film 416. In this state, portions of the metal film 416 which are not covered with the resist mask 420 are entirely anodized in the direction of thickness.

This anodizing process is performed as follows. As shown in FIG. 4, 6, or 10, the substrate 411 is dipped into the electrolyte to oppose the opposing electrode, and a voltage is applied between the metal film 416 as an anode and the opposing electrode as a cathode.

When the voltage is applied between the metal film (anode) 416 and the opposing electrode (cathode) in the electrolyte, a chemical reaction of the metal film 416 is caused, and the portions of the metal film 416 which are not covered with the resist mask 420 are anodized from their surfaces in the direction of thickness.

In this case, the depth of anodized state of the metal film 416 in the direction of thickness is mainly determined by the magnitude of an applied voltage. Therefore, if the applied voltage is sufficiently increased, the metal film 416 can be entirely anodized.

When this anodizing process is performed, the portions of the metal film 416 which are covered with the resist mask 420 are not oxidized and are left as metal films. These portions are formed into the source and drain electrodes 416a and 416b and the lead portions, and the other regions, i.e., the stepped portion between the source electrode 416a portion and the drain electrode 416b portion, the portions other than the source and drain electrode portions and the lead portions, become the oxide insulating layers 416c which are entirely anodized in the direction of thickness.

[Step 6]

Figure 18F:
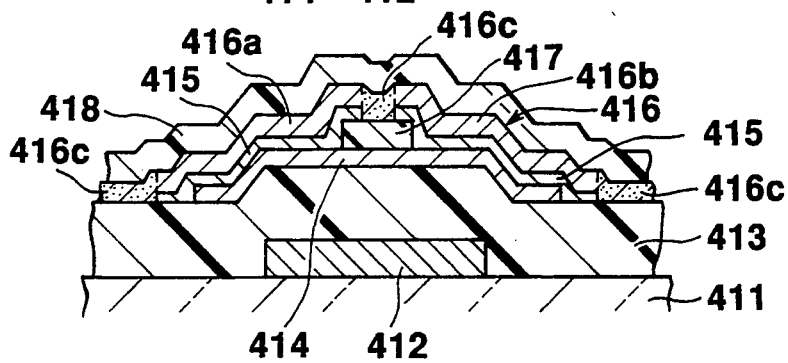

Subsequently, the resist mask 420 is removed, and the protective insulating film 418 is formed, as shown in FIG. 18F, thereby completing a thin-film transistor.

The protective insulating film 418 is formed by depositing SiN by the plasma CVD unit.

In this embodiment, since the metal film is composed of the Ti-containing Al material, the surfaces of the source and drain electrodes 416a and 416b and their lead portions, which are composed of the non-oxidized portions of the metal film 416, are not coarsened upon formation of the protective insulating film 418. In addition, since the surface of the oxide insulating layer 416c of the metal film 416 is coarsened less, the protective insulating film 418 is free from defects such as cracks.

Note that the film formation temperature of the protective insulating film 418 is the same as that of the gate insulating film 413. Therefore, the surface of the gate electrode 412 is not coarsened upon formation of the protective insulating film 418.

That is, in the thin-film transistor of the above-described embodiment, the source and drain electrodes 416a and 416b are not separated by the channel region by etching but are electrically separated from each other in the following manner. The source and drain electrodes 416a and 416b are formed from the continuous metal film 416. The region of the metal film 416 which is located between the source and drain electrodes 416a and 416b is then entirely anodized in the direction of thickness, thereby electrically separating the source and drain electrodes 416a and 416b from each other. If the source and drain electrodes 416a and 416b are formed from the continuous metal film 416 in this manner, there is almost no steps between the upper surfaces of the source and drain electrodes 416a and 416b and the portion therebetween (the upper surface of the oxide insulating layer 416c of the metal film 416).

In other words, if the entire metal film 416 is uniform in thickness, the steps between the upper surfaces of the source and drain electrodes 416a and 416b, composed of the non-oxidized portions of the metal film 416, and the upper surface of the oxide insulating layer 416c between the two electrodes 416a and 416b are as small as a value corresponding to the thickness of the n-type semiconductor layer 415. Since the thickness of the n-type semiconductor layer 415 is as very small as several tens nm, the steps are very small.

If the steps between the upper surfaces of the source and drain electrodes 416a and 416b and the portion between the two electrodes 416a and 416b are small, the protective insulating film 418 is deposited on these stepped portions to a sufficient thickness. Therefore, the portions corresponding to the edge portions of the source and drain electrodes 416a and 416b which are located on the channel region side can be covered with the protective insulating film 418 having defects such as pinholes and cracks.

In this embodiment, since patterning of the metal film 416 is not performed by etching, and the portions of the metal film 416 other than the source and drain electrode portions and the lead portions are entirely anodized in the direction of thickness to be formed into the oxide insulating layers 416c, almost no steps are present between the source and drain electrodes 416a and 416b, the lead portions, and the other portions. Consequently, the edge portions other than those of the source and drain electrodes 416a and 416b on the channel region side, and the two edge portions of each lead portion can be covered with the sufficiently thick protective insulating film 418 without defects such as pinholes and cracks. In the above embodiment, since the Ti-containing Al material is used for the metal film 416 from which the gate electrode 412 and the source and drain electrodes 416a and 416b are formed, these electrodes have small resistance values. In addition, when the gate insulating film 413 and the protective insulating film 418 are formed, since the surfaces of the gate electrode 412 and the metal film 416 are not coarsened, no defects such as cracks are caused in the gate insulating film 413 and the protective insulating film 418.

As described above, the protective insulating film 418 covering the upper portion of the thin-film transistor has excellent quality without any defects such as pinholes and cracks. Therefore, in the etching process of forming other electrodes (e.g., a pixel electrode) on the protective insulating film 418, there is no possibility that an etching medium (etchant or etching gas) enters through defects in the protective insulating film 418 to corrode the source and drain electrodes 416a and 416b and the lead portions formed thereunder.

Note that in the above embodiment, patterning of the source/drain electrode metal film 416 is not performed by etching, but the portions of the metal film 416 other than the source and drain electrode portions and the lead portions are entirely anodized in the direction of thickness to be formed into the oxide insulating layers 416c. However, these portions of the metal film 416 other than the source and drain electrode portions and the lead portions may be removed by etching.

In this case, however, the process of forming the source and drain electrodes 416a and 416b includes two processes, i.e., the process of patterning the metal film by etching, and the process of anodizing the portion between the source and drain electrodes 416a and 416b.

In addition, according to the above embodiment, the Ti-containing Al material is used for the gate electrode 12 and the source/drain electrode metal film 416. However, other metals such as Ta, a Ta-Mo alloy, and Cr may be used to form the gate electrode 412 and the source/drain electrode metal film 416 as long as they can prevent the surfaces of the gate insulating film 413 and the protective insulating film 418 from being coarsened in the film formation process.

[Third Embodiment]

According to the third embodiment, in a thin-film transistor, instead of removing a portion, of an n-type semiconductor layer, corresponding to a channel region by etching, the portion is entirely anodized in the direction of thickness to be formed into an oxide insulating layer, thereby electrically separating the n-type semiconductor layer into two layers by the channel region.

The third embodiment of the present invention will be described below with reference to FIGS. 19 to 20E.

Figure 19:
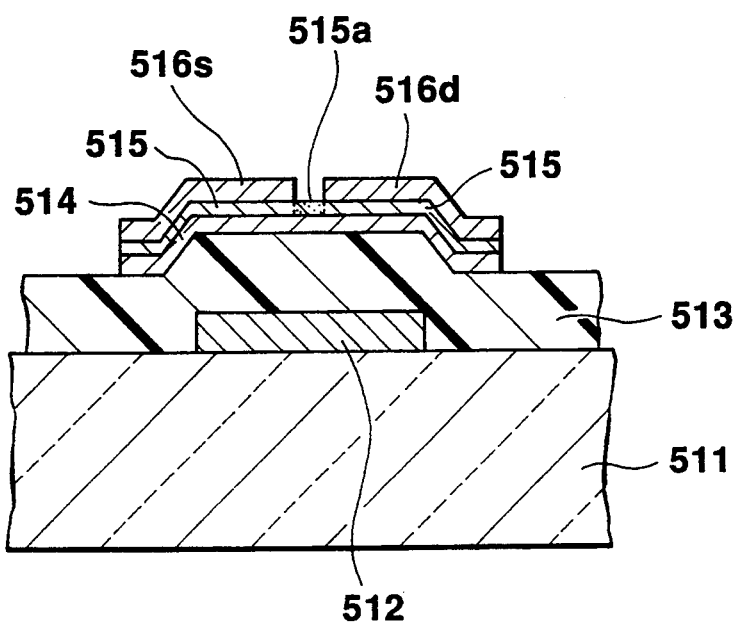
FIG. 19 is a sectional view showing the structure of a TFT element according to the third embodiment of the present invention.

FIG. 19 is a sectional view showing a thin-film transistor of this embodiment.

This thin-film transistor comprises a gate electrode 512 formed on an insulating substrate 511 consisting of glass or the like, a gate insulating film 513 covering the gate electrode 512, a semiconductor film 514 formed on the gate insulating film 513 to oppose the gate electrode 513, and source and drain electrodes 516s and 516d formed on the two sides of the semiconductor film 514 through ohmic contact layers, each consisting of an n-type semiconductor film 515.

Note that the gate electrode 512 is composed of a metal such as Ta (tantalum), a Ta-Mo (tantalum-molybdenum) alloy, Cr (chromium), or an Al alloy, and the gate insulating film 513 is composed of SiN (silicon nitride).

In addition, the semiconductor film 514 is composed of a-Si (amorphous silicon); the n-type semiconductor layer 515, n-type a-Si doped with an impurity; and the source and drain electrodes 516s and 516d, a metal such as Cr having a good contact property with respect the n-type semiconductor layer 515.

Furthermore, the n-type semiconductor layer 515 is formed on the entire surface of the semiconductor film 514 to also cover the channel region. The n-type semi10 conductor layer 515 is electrically separated into two layers by the channel region by anodizing the entire portion of the layer 515 which corresponds to the channel region so as to form an oxide insulating layer 515a.

FIGS. 20A to 20E show the steps of a method of manufacturing the thin-film transistor. The thin-film transistor is manufactured in the following steps.

[Step 1]

Figure 20A:
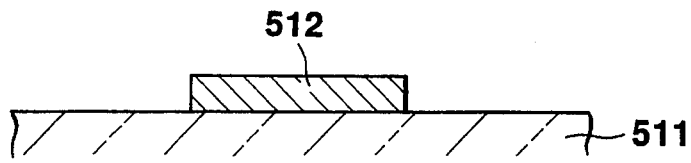
FIGS. 20A to 20E are sectional views sequentially showing the steps in manufacturing the TFT element of the third embodiment shown in FIG. 19.

As shown in FIG. 20A, the gate electrode 512 is formed on the substrate 511. The gate electrode 512 is formed by depositing a metal film, e.g., a Ta, Ta-Mo alloy, Cr, or Al alloy film, on the substrate 511 by a sputtering unit, and patterning the metal film by etching.

[Step 2]

Figure 20B:
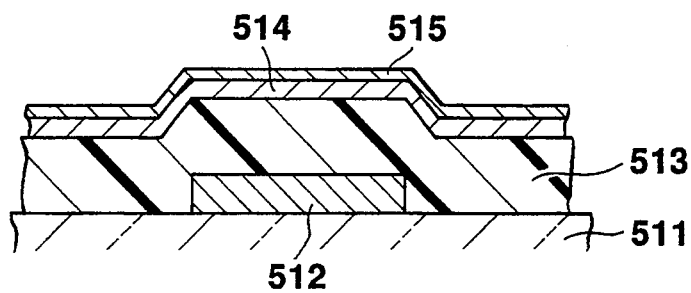

As shown FIG. 20B, the gate insulating film (SiN film) 513, the semiconductor film (a-Si layer) 514, and the n-type semiconductor layer (n-type a-Si layer) 515 are sequentially formed on the substrate 511, on which the gate electrode 512 has been formed, by a plasma CVD unit.

[Step 3]

Figure 20C:
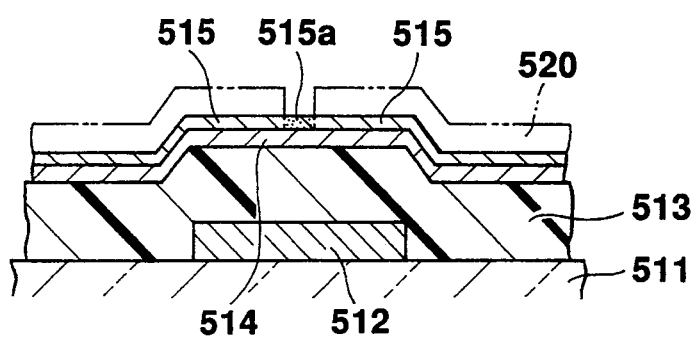

As shown in FIG. 20C, a resist mask 520 is formed on the n-type semiconductor layer 515 to cover the entire upper surface of the n-type semiconductor layer 515 except for the portion corresponding to the channel region of the semiconductor layer 514. In this state, the portion of the n-type semiconductor layer 515 which corresponds to the channel region is anodized.

The n-type semiconductor layer 515 is anodized as follows. The substrate 511 is dipped into an electrolyte such that the n-type semiconductor layer 515 on the substrate 511 opposes an electrode in the electrolyte. A voltage is then applied between the n-type semiconductor layer 515 as an anode and the electrode as a cathode.

When the voltage is applied between the two electrodes in the electrolyte in this manner, a chemical reaction is caused in the portion of the n-type semiconductor layer 515 which is not covered with the resist mask 520, and the portion is anodized to be formed into an oxide insulating layer 515a.

This anodizing process is performed by using the anodizing unit shown in FIG. 4 or 6. The n-type semiconductor layer is anodized by applying a voltage between the film and the cathode while radiating light onto the film.

While no voltage is applied to the n-type semiconductor film (n-Si), the resistance of the film is kept high. When a voltage having a certain magnitude or more is applied to the film a current flows. For this reason, in the anodizing process of the n-type Si film, an energization voltage having a certain value is applied to the film to cause a current to flow in the film, and a voltage obtained by adding an anodizing voltage to the energization voltage is applied to the film.

Subsequently, a voltage two or more times a reference voltage obtained by dividing the thickness of the n-Si film by and an oxidation progress depth per unit voltage is applied between the n-Si film and the cathode, thus anodizing the n-Si film.

The following are anodizing conditions for the n-Si film, provided that the film has a thickness of 50 nm:

applied voltage: 160 V or more
current density: 0.5 to 2 mA/cm$^2$

Note that the electrolyte is a solution obtained by dissolving 0.04N potassium nitrate in a glycerine (ethylene glycol) solvent.

The value of the applied voltage corresponds to the value of the anodizing voltage to be applied together with the energization voltage.

When the n-Si film is anodized by using the above electrolyte, the oxidation progress depth per unit voltage is about 0.6 nm/V. The voltage twice or more the reference voltage (50/0.6 V) obtained by dividing the thickness (50 nm) of the n-Si film by the oxidation progress depth is 160 V or more.

If the voltage to be applied between the n-Si film and the cathode is set to be twice or more the reference voltage obtained by dividing the thickness of the n-Si film by the oxidation progress depth per unit voltage, the apparent maximum progress depth of an oxide layer (SiO layer) formed from the surface of the n-Si film in the direction of film thickness exceeds the actual thickness of the n-Si film, thus oxidizing the entire n-type film.

According to this anodizing method, therefore, the n-Si film can be entirely oxidized to obtain an insulating film (SiO film) which is entirely composed of an insulating layer.

In the anodizing method, if the applied voltage is set to less than twice the reference voltage, a very thin lower layer of a film to be oxidized is sometimes left as a non-oxidized n-Si film. In contrast to this, if the applied voltage is set to be twice or more the reference voltage, the n-type film to be oxidized can be reliably oxidized entirely in the direction of thickness.

Furthermore, in this embodiment, it is preferable that the applied voltage be limited to the allowable voltage or less within which breakdown of the insulating film (SiO film) obtained by anodizing the n-type film does not occur. Note that this anodizing method can be applied to a p-type semiconductor film doped with p-type impurities.

[Step 4]

Figure 20D:
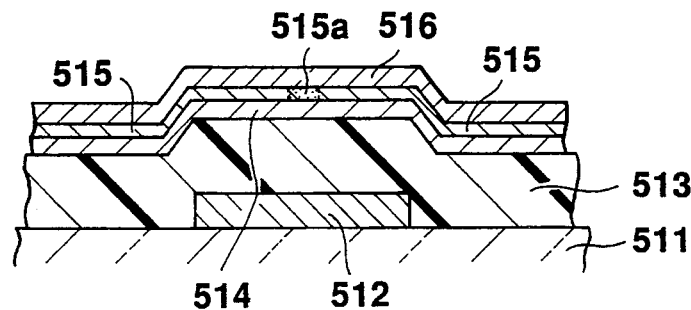

The resist mask 520 is removed. Thereafter, as shown in FIG. 20D, a source/drain electrode metal film 516 consisting of Cr or the like is formed on the n-type semiconductor film 515 by the sputtering unit.

[Step 5]

Figure 20E:
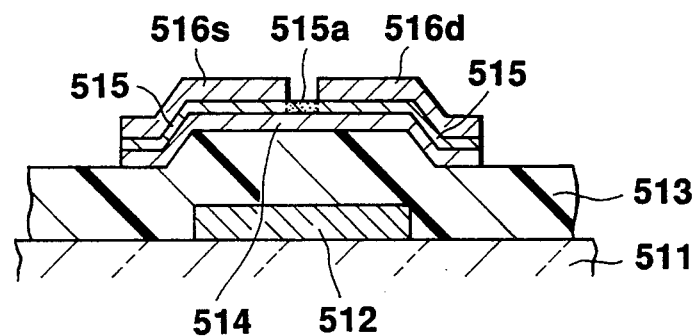

As shown in FIG. 20E, the source/drain electrode metal film 516 and the layer and the film formed thereunder, i.e., the n-type semiconductor film 515 and the i-type semiconductor layer 514, are patterned in predetermined shapes by photoetching. Furthermore, a portion of the source/drain electrode metal film 516 which corresponds to the channel region is removed by photoetching, thereby separating the metal film 516 into the source and drain electrodes 516s and 516d. With this process, a thin-film transistor is completed.

The metal film 516 is etched by using an etching medium (an etching gas or etchant) with a large etching selection ratio of the i-type semiconductor film 514 to the n-type semiconductor film 515.

If such an etching medium is used, the portion (oxide insulating layer 515a) of the n-type semiconductor film which corresponds to the channel region is scarcely etched when the metal film 516 is etched to be separated into the source and drain electrodes 516s and 516d. In addition, since the channel region of the semiconductor film 514 is covered with the oxide insulating layer 515a of the n-type semiconductor layer 515, 10 the surface of the channel region of the semiconductor film 514 is not damaged by etching.

That is, in the thin-film transistor of the above-described embodiment, instead of removing the portion, of the n-type semiconductor layer 515, corresponding to the channel region by etching as in the prior art, the portion is entirely anodized in the direction of thickness to be formed into the oxide insulating layer 515a, thereby electrically separating the n-type semiconductor layer 515 into two portions by the channel region.

According to this thin-film transistor, since the portion of the n-type semiconductor layer 515 which corresponds to the channel region is not removed by etching, unlike in the prior art, the semiconductor film 514 is not damaged in the manufacturing process even if no blocking insulating film is formed on the channel region of the semiconductor film 514. Since the blocking insulating film need not be formed, the thin-film transistor can be manufactured by a smaller number of manufacturing steps and at a lower cost as compared with the conventional thin-film transistor.

Since this thin-film transistor can be manufactured without forming and patterning a blocking insulating film, there is no possibility unlike in the conventional thin-film transistor that pinhole defects are caused in a gate insulating film upon formation of a blocking insulating film.

In the above-described embodiment, the semiconductor film 514, the n-type semiconductor layer 515, and the source/drain electrode metal film 516 are continuously formed, and the semiconductor film 514 is patterned when the source/drain electrode metal film 516 and the n-type semiconductor layer 515 formed thereunder are patterned. However, the semiconductor film 514 may be patterned in a predetermined shape before the n-type semiconductor layer 515 and the source/drain electrode metal film 516 are formed. In this case, patterning of the n-type semiconductor layer 515 may not performed by etching, but the entire n-type semiconductor layer 515 except for the portions under the source and drain electrodes 516s and 516d may be anodized.

[Fourth Embodiment]

The fourth embodiment of the present invention will be described below with reference to FIGS. 21 to 22D.

Figure 21:
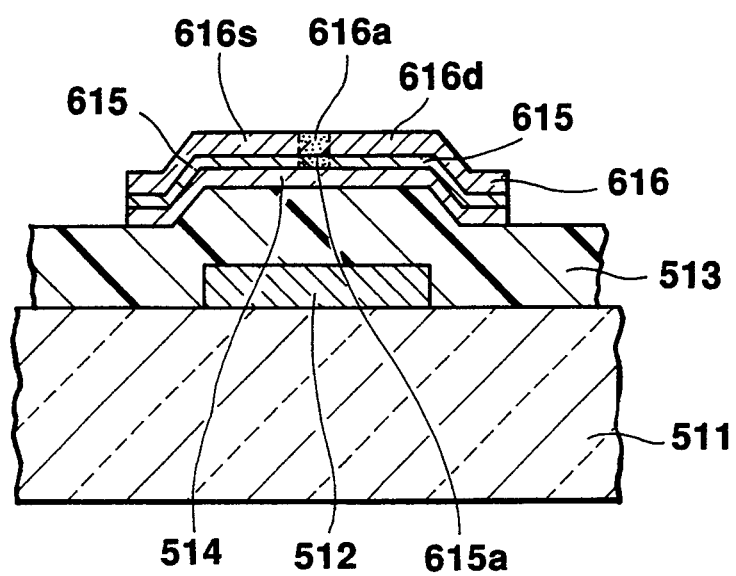
FIG. 21 is a sectional view showing the structure of a TFT element according to the fourth embodiment of the present invention.

In a thin-film transistor of this embodiment, as shown in FIG. 21, not only an n-type semiconductor layer 615 but also source/drain electrode metal film 616 are formed to cover a channel region, and a portion of the metal film 616 which corresponds to the channel region is entirely anodized in the direction of thickness to be formed into an oxide insulating layer 616a, thereby electrically separating source and drain electrodes 616s and 616d, each composed of the metal film 616, from each other.

Note that the arrangement of the thin-film transistor of this embodiment is the same as that of the thin-film transistor of the third embodiment shown in FIG. 19 except for the above-described structure of the source and drain electrodes 616s and 616d. Therefore, the same reference numerals in the fourth embodiment denote the same parts as in the third embodiment, and a description thereof will be omitted.

FIGS. 22A to 22D show the steps in manufacturing the above-described thin-film transistor. This thin-film transistor is manufactured in the following steps.

[Step 1]

Figure 22A:
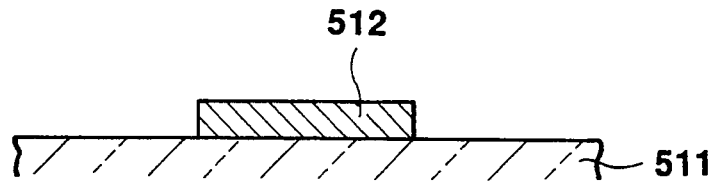
FIGS. 22A to 22D are sectional views sequentially showing the steps in manufacturing the TFT element of the fourth embodiment shown in FIG. 21.

As shown in FIG. 22A, a gate electrode 512 is formed on a substrate 511 in the same manner as in the third embodiment.

[Step 2]

Figure 22B:
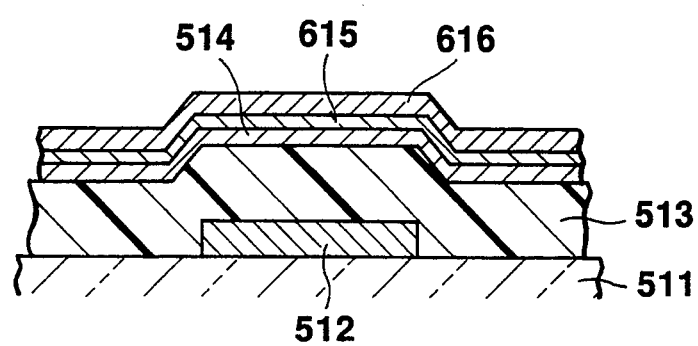

As shown in FIG. 22B, a gate insulating film 513, a semiconductor film 514, and an n-type semiconductor layer 615 are sequentially formed on the substrate 511, on which the gate electrode 512 has been formed, by a plasma CVD unit. A source/drain electrode metal film 616 is formed on the resultant structure by a sputtering unit.

[Step 3]

Figure 22C:
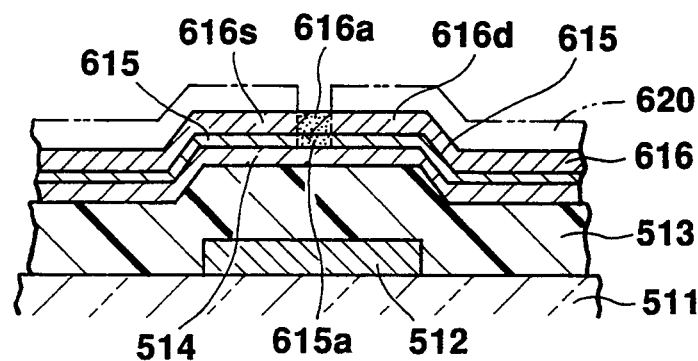
Figure 22D:
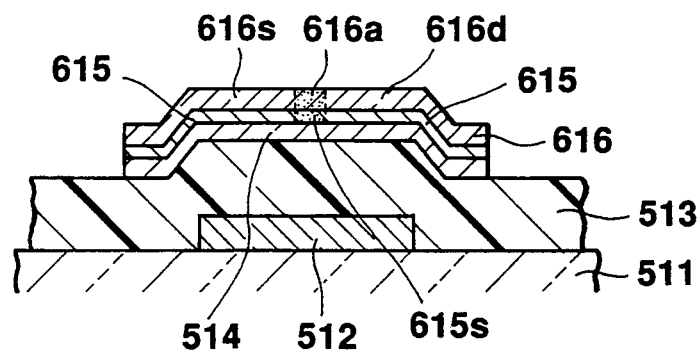

As shown in FIG. 22C, a resist mask 620 is formed on the source/drain electrode metal film 616 to cover 10 the entire metal film 616 except for a portion corresponding to the channel region of the semiconductor film 514. In this state, the portions, of the metal film 616 and the n-type semiconductor layer 615 formed thereunder, which correspond to the channel region, are anodized.

Similar to the third embodiment, the metal film 616 and the n-type semiconductor layer 615 are anodized in such a manner that the substrate 511 is dipped into an electrolyte, and a voltage is applied between a pair of the metal film 616 and the n-type semiconductor layer 615 as an anode and an opposing electrode as a cathode.

In this case, if the applied voltage is sufficiently high, the portions of the metal film 616 and the n-type semiconductor layer 615 which correspond to the channel region can be entirely anodized in the direction of thickness.

[Step 4]

The resist mask 620 is removed. Thereafter, as shown in FIG. 22D, the source/drain electrode metal film 616 and the layer and the film formed thereunder, i.e., the n-type semiconductor layer 615 and the semiconductor film, are patterned in predetermined shapes by photoetching, thereby completing a thin-film transistor.

In this case, since the metal film 616 is not separated into the source and drain electrodes 616s and 616d by etching, not only the channel region of the semiconductor film 514 but also the portion of the n-type semiconductor 515 which corresponds to the channel region are free from damage caused by etching.

That is, in the thin-film transistor of this embodiment, while the portion of the n-type semiconductor layer 616 which corresponds to the channel region is entirely anodized and formed into the oxide insulating layer 615a to electrically separate the n-type semiconductor layer 615 into two portions by the channel region, the source/drain electrode metal film 616 formed thereon is also formed to cover the channel region, and the portion of the metal film 616 which corresponds to the channel region is entirely anodized in the direction of thickness to be formed into the oxide insulating layer 616a, thus electrically separating the metal film 616 into the source and drain electrodes 616s and 616d.

Similar to the above embodiment, according to this thin-film transistor, since the portion of the n-type semiconductor layer 615 which corresponds to the channel region is not removed by etching, unlike in the conventional method, the i-type semiconductor layer 514 is not damaged even if no blocking insulating film is formed on the channel region of the i-type semiconductor layer 514. Since the above-mentioned blocking film is not required, the thin-film transistor can be manufactured by a smaller number of manufacturing steps and at a lower cost as compared with the conventional thin-film transistor. In addition, since the thin-film transistor can be manufactured without forming and patterning a blocking insulating film, there is no possibility unlike in the conventional thin-film transistor that pinhole defects are caused in a gate insulating film upon formation of a blocking insulating film.

Furthermore, in the thin-film transistor of this embodiment, since the portions of the source/drain electrode metal film 616 and the n-type semiconductor layer 615 which correspond to the channel region are anodized by using the same resist mask 620, only one anodizing process is required. In addition, unlike the third embodiment, the portion of the source/drain electrode metal film 616 which corresponds to the channel region need not be removed by etching to separate the metal film 616 into the source and drain electrodes 616s and 616d. Therefore, the thin-film transistor of this embodiment can be manufactured by a smaller number of manufacturing steps than that of the thin-film transistor of the third embodiment.

Note that in the thin-film transistor of the fourth embodiment, the semiconductor film 514 can also be patterned in a predetermined shape before the n-type semiconductor layer 615 and the source/drain electrode metal film 616 are formed. In this case, patterning of the source/drain electrode metal film 616 and the n-type semiconductor layer 616 is not performed by etching, but the metal film 616 and the n-type semiconductor layer 615 excluding the source and drain electrode portions may be entirely anodized (if the source and drain electrodes 616s and 616d and their lead portions are composed of the same metal film 616, the lead portions are also excluded).

[Fifth Embodiment]

According to the fifth embodiment of the present invention, in a thin-film transistor, a blocking layer on a semiconductor film is composed of a metal oxide film formed by anodizing a metal film entirely in the direction of thickness.

An embodiment in which the TFT element of the present invention is applied to a TFT panel used for an active matrix liquid crystal display element will be described below with reference to FIGS. 23 to 26.

Figure 23:
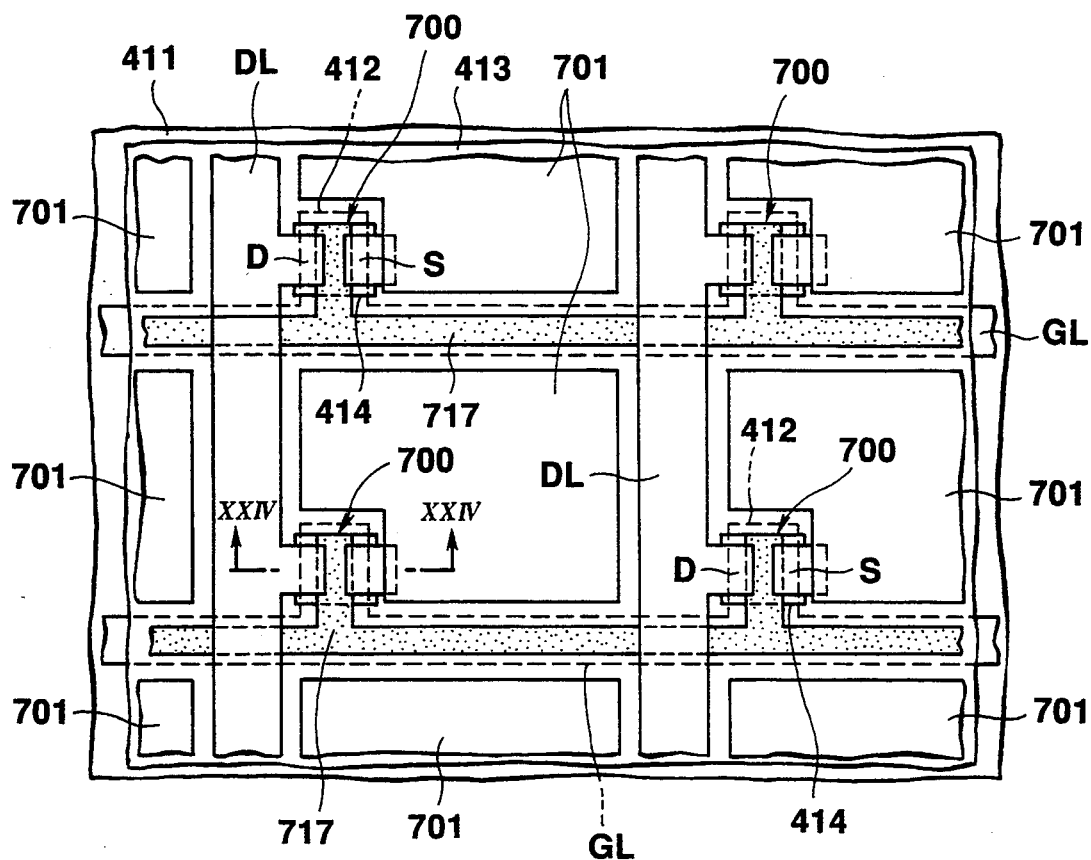
FIG. 23 is a plan view showing the arrangement of a TFT panel using TFT elements according to the fifth embodiment of the present invention.
Figure 24:
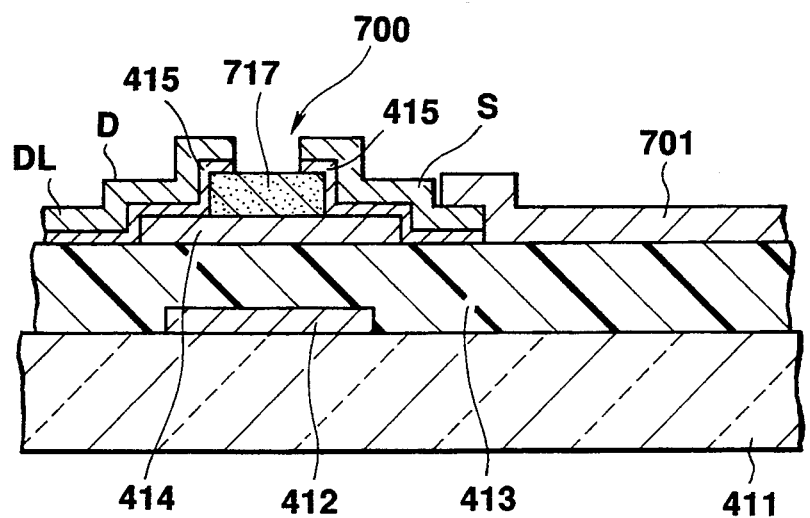
FIG. 24 is a sectional view showing the structure of the TFT element according to the fifth embodiment of the present invention.

Of FIGS. 23 to 25, FIG. 23 is a plan view of the TFT panel, and FIG. 24 is a sectional view of one thin-film transistor of the TFT panel. The same reference numerals in FIGS. 23 and 24 denote the same parts as in the second embodiment, and a description thereof will be omitted.

In this TFT panel, the following components are formed on a transparent insulating substrate 414 consisting of glass: a large number of pixel electrodes 701; a large number of thin-film transistors 700 as active elements; gate lines GL connected to gate electrodes 412 of the thin-film transistors 700, and data lines DL connected to drain electrodes D of the thin-film transistors 700.

The gate electrodes 412 of the thin-film transistors 700 are integrally formed with the gate lines GL, and the drain electrodes D are continuously formed with the data lines DL. Source electrodes S are respectively connected to the pixel electrodes 701. In addition, a gate insulating film 413 is formed on almost the entire surface of the substrate 411 to cover the gate lines GL, and the pixel electrodes 701 and the data lines DL are formed on the gate insulating film 413.

In the TFT element of this embodiment, a blocking layer consisting of a metal oxide film 717 formed by anodizing a metal film entirely in the direction of thickness is formed on a semiconductor film 414 of each thin-film transistor 700. This metal oxide film 717 is composed of, e.g., Al oxide ($Al_2O_3$) or an aluminum alloy oxide obtained by anodizing Al (aluminum) or an aluminum alloy.

This Al oxide film 717 is an insulating film. Therefore, even if a blocking layer is composed of the Al oxide film 717, no short-circuiting occurs between the source electrode S and the drain electrode D.

The Al oxide film 717 is formed as follows. An Al film is formed first. The Al film is then patterned in the shape of a blocking layer. Finally, the patterned Al film is anodized. The Al oxide film 717 is formed on the channel region of the semiconductor film 414 and on the gate insulating film 413.

The Al oxide film 717 on the gate insulating film 413 is formed in a region on the gate line GL to linearly extend therealong. The two ends of this linear portion reach edge portions of the gate insulating film 413 formed on almost the entire surface of the substrate 411. The linear portion of this Al oxide film 717 has a width slightly smaller than that of the gate line GL.

FIGS. 25A to 25G show the steps of a method of manufacturing the above-described TFT panel. The TFT panel is manufactured in the following steps.

[Step 1]

Figure 25A:
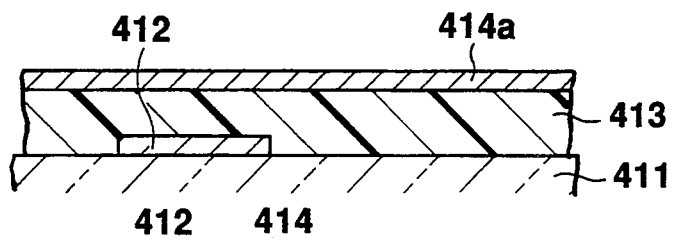
FIGS. 25A to 25G are sectional views sequentially showing the steps in manufacturing the TFT element of the fifth embodiment shown in FIG. 24.

As shown in FIG. 25A, the gate electrode 412 and the gate line are formed on the substrate 411. The gate insulating film (SiN film) 413 and an i-type semiconductor layer 414a are sequentially formed on the resultant structure. The gate electrode 412 and the gate line GL are formed by sputtering, whereas the gate insulating film 413 and the i-type semiconductor layer 414a are continuously formed by plasma CVD.

[Step 2]

Figure 25B:
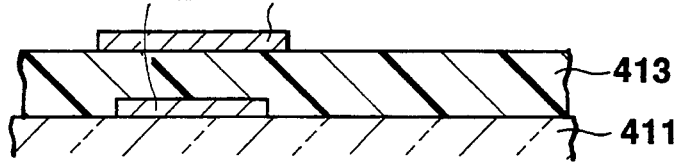

As show in FIG. 25B, the i-type semiconductor layer 414a is patterned in a predetermined shape by photolithography. Patterning of this i-type semiconductor layer 414a is performed by a dry etching method using a gas mixture of carbon tetrachloride and helium as an etching gas.

[Step 3]

Figure 25C:
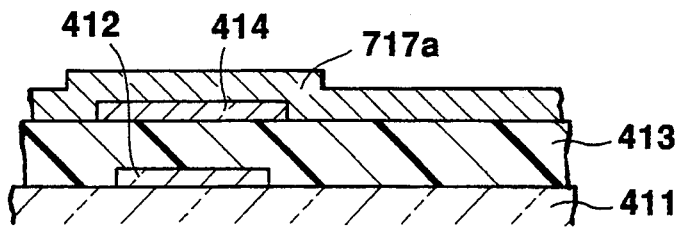

As shown in FIG. 25C, an Al film 717a as a blocking layer is formed on the semiconductor film 414 and the gate insulating film 413 by sputtering to cover almost the entire surface of the gate insulating film 413.

[Step 4]

Figure 25D:
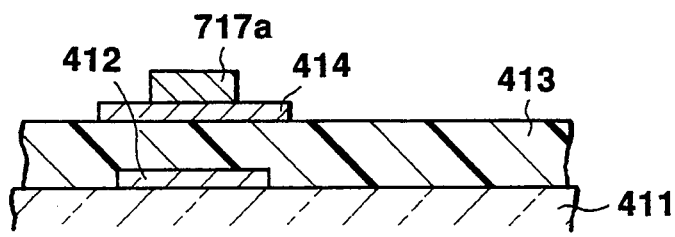

As shown in FIG. 25D, the Al film 717a is patterned into a blocking layer formed on the channel region of the semiconductor film 414 and the linear portion extending along the gate line GL by photolithography. Patterning of this Al film is performed by wet etching.

In this case, the surfaces of the gate insulating film 413 and the semiconductor film 414, which are exposed upon patterning of the i-type semiconductor layer 414a, are exposed to an etchant applied to the Al film 717a. However, since the Al film 717, the gate insulating film (SiN film) 413, and the semiconductor film 414 are composed of different materials, the gate insulating film 413 and the semiconductor film 414 are not etched by the etchant used for patterning the Al film 717a.

[Step 5]

Figure 25E:
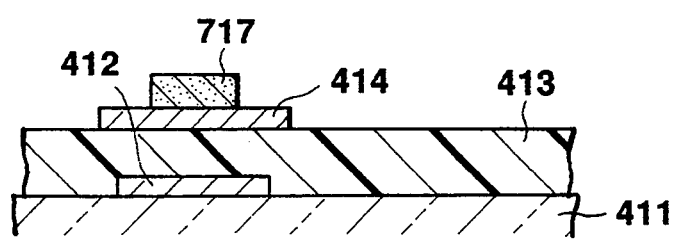

As shown in FIG. 25E, the Al film 717a is entirely anodized in the direction of thickness to form the Al film 717a into the oxide Al ($Al_2O_3$) film 717.

The Al film 717a is anodized by the same anodizing method as that shown in FIG. 4 or 6. That is, the substrate 411 is dipped into the electrolyte such that the Al film 717a opposes an opposing electrode (platinum). A voltage is the applied between the Al film 717a as an anode and the opposing electrode as a cathode.

When the voltage is applied between the Al film 717a and the opposing electrode in the electrolyte, a chemical reaction of the Al film 717a as the anode occurs, and the film 717a is anodized to be formed into the oxide Al film 717.

In this case, since the Al film 717a is patterned into the blocking layer formed on the channel region of the semiconductor film 414 and the linear portion extending along the gate line GL, when clip members or the like are connected to the two end portions of the linear portion of the Al film 717a, and a voltage is applied to the two end portions of the linear portion and to the overall Al film 717a to anodize it entirely. Therefore, blocking layers, each consisting of the oxide Al film 717, can be simultaneously formed on the semiconductor films 414 of thin-film transistors arranged along the gate lines.

[Step 6]

Figure 25F:
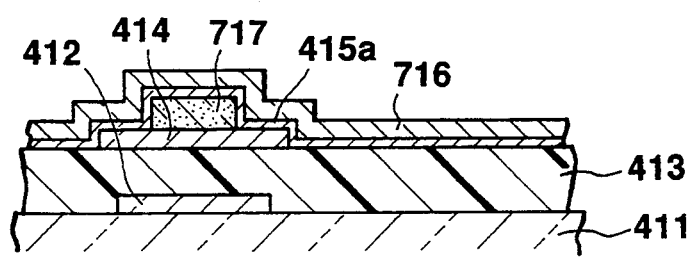

As shown in FIG. 25F, an n-type semiconductor layer 415a and a source/drain metal film 716 are sequentially formed. Note that the n-type semiconductor layer 415a is formed by plasma CVD, whereas the source/drain metal film 716 is formed by sputtering.

[Step 7]

Figure 25G:
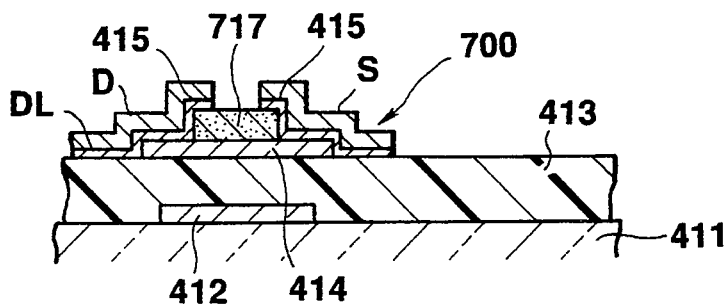

Subsequently, as shown in FIG. 25G, the source/drain electrode metal film 716 is patterned into the source and drain electrode S and D and the data line DL by lithography. In addition, the n-type semiconductor layer 415a is removed by etching except for portions corresponding to the source and drain electrodes S and D and a portion under the data line DL so as to form an ohmic contact layer 415, thereby completing the thin-film transistor 700.

Although patterning of the source/drain metal film 716 is performed by wet etching, since the Al oxide film 717 is scarcely etched by the etchant applied to the source/drain electrode metal film 716, the Al oxide film 717 is not removed even if it is thin.

In addition, the n-type semiconductor layer 415a is etched by the same etching gas as that used for etching the i-type semiconductor layer 414a. However, since the channel region of the i-type semiconductor layer 414a is covered with the blocking layer consisting of the Al oxide film 717, the channel region of the i-type semiconductor layer 414a is not damaged when the n-type semiconductor layer 415a is etched.

Subsequently, a transparent conductive film such as an ITO film is formed on the gate insulating film 413 by sputtering. This transparent conductive film is patterned by photolithography to form the pixel electrode 701, thus completing the TFT shown in FIGS. 23 and 24.

In this embodiment, the Al film 717a serving as the blocking layer is formed after the i-type semiconductor 414a is patterned. Assuming, however, that even if the i-type semiconductor layers 414a of the respective thin-film transistors 700 are continuous, the characteristics of each thin-film transistor are not affected, patterning of the i-type semiconductor layer 717a may be performed after the Al film 717a is formed and patterned. In this case, the i-type semiconductor layer 414a is left under the linear portion of the Al oxide film 717 obtained by anodizing the Al film 717a while the layer 414a is continuous with the semiconductor film 414 of the thin-film transistor 700.

In the TFT panel of this embodiment, the blocking layer to be formed on each semiconductor film 414 is composed of the Al oxide film 717 obtained by anodizing the Al film. As described above, this Al oxide film 717 is formed by forming and patterning the Al film 717a and anodizing it entirely in the direction of thickness.

Since the Al film 717a and the gate insulating film (SiN film) 413 are composed of totally different materials, the gate insulating film 413 is not etched by an etchant used for patterning the Al film 717a. Therefore, the blocking layer can be formed on the channel region of the semiconductor film 414 without etching the gate insulating film 413. This prevents short-circuiting between the thin-film transistors 700 and between the lines GL and DL, and increases the yield of TFT panels.

In the above-described embodiment, the Al oxide film 717 is formed on the channel region of the semiconductor film 414 and the gate insulating film 413, while the Al film 717 on the gate insulating film 413 is formed into the linear portion extending along the gate line GL. Since the Al oxide film 717 can be formed by patterning the Al film 717a in the above-mentioned shape, and applying a voltage to the Al film 717a from the end portions of the linear portion to anodize the entire Al film 717a, the blocking layers, each consisting of the Al oxide film 717, can be simultaneously formed on the semiconductor films 414 of the thin-film transistors 700 arranged along the gate lines GL.

In addition, according to the above embodiment, since the linear portion formed on the gate insulating film 413 of the Al oxide film 717 is formed on the region of the gate line GL to extend therealong, and the width of the linear portion is set to be smaller than that of the gate line GL, the formation of the linear portion of the Al oxide film 717 on the gate insulating film 413 does not limit the formation region of the pixel electrode 701.

Figure 26:
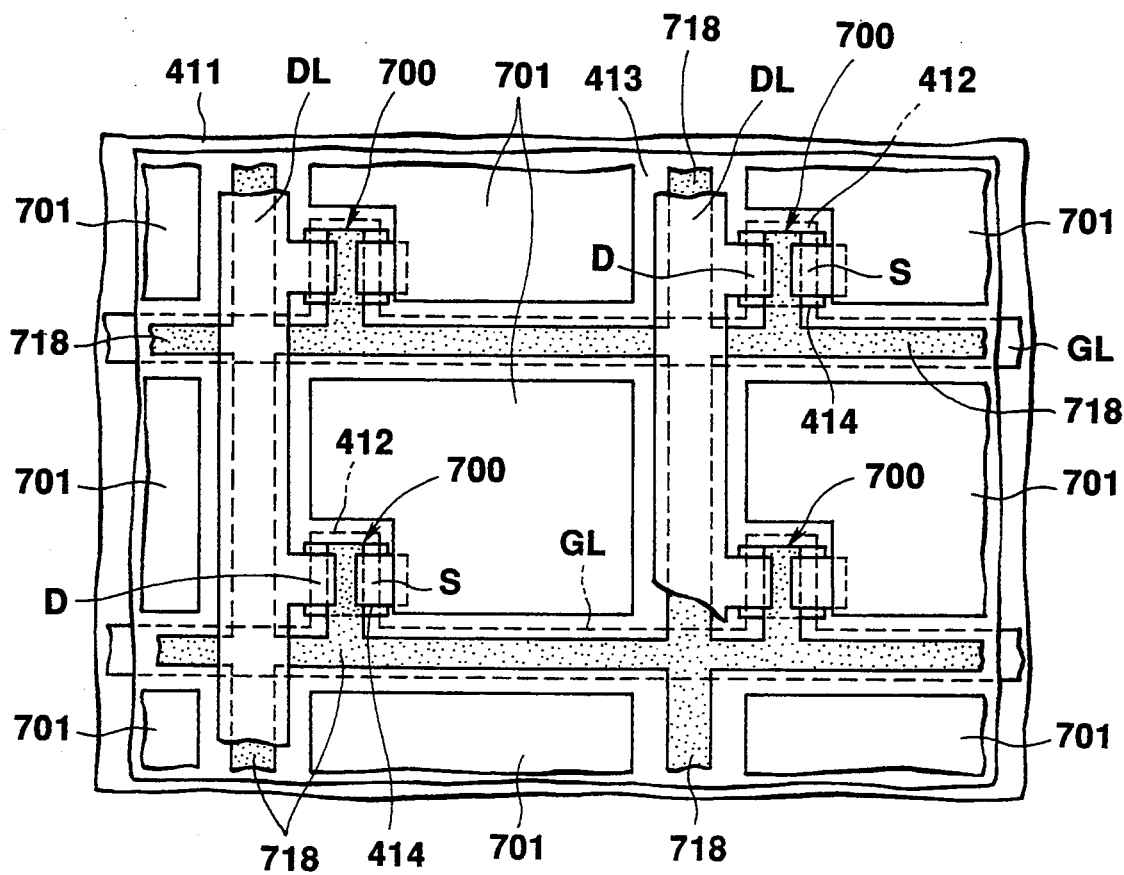
FIG. 26 is a plan view showing the arrangement of a TFT panel using a modification of the TFT elements according to the fifth embodiment of the present invention.

FIG. 26 is a plan view showing part of a modification of the TFT panel of the fifth embodiment.

In this TFT panel, Al oxide films 718 on gate insulating films 413 are formed on regions on gate lines GL and regions under data lines DL in the form of a matrix so as to extend along the gate and data lines GL and DL.

Since the TFT panel of this modification has the same arrangement as that of the fifth embodiment described above except that the Al films 718 of the gate insulating films 413 are formed in regions under the data lines DL, the same reference numerals in the modification denote the same parts as in the fifth embodiment, and a description thereof will be omitted.

In the TFT panel of this modification, the Al film 717a is also left as a linear portion in the formation region of the data line DL in the patterning process of the Al film 717a shown in FIG. 25D, and the Al film 717a in the formation region of the data line DL is simultaneously anodized in the anodizing process shown in FIG. 25E. With this process, the TFT panel of the modification can be manufactured in the same manner as the manufacture of the TFT panel of the fifth embodiment.

In the TFT panel of this modification, the Al oxide film 718 as a blocking layer is formed on the channel region of the semiconductor film 414 and the gate insulating film 413, and the metal oxide film on the gate insulating film 413 is formed in the region on the gate line GL and the region under the data line DL in the form of a matrix so as to extend along the gate and data lines GL and DL. Therefore, when the Al film 717a patterned in such a shape is to be anodized to form the Al oxide film 718, a voltage can be applied from the two end portions of the linear portion, of the Al film 717a, extending along the gate line GL, and from the two end portions of the linear portion, of the Al film 717a, extending along the data line DL, thereby uniformly anodizing the entire Al film 717a.

According to this modification, therefore, the blocking layers, each consisting of the uniform Al film 718, can be simultaneously formed on the semiconductor films 414 of all the thin-film transistors 700.

Note that in the above embodiment, the metal oxide film 717 or 718 serving as a blocking layer is composed of the Al oxide film 717a. However, this metal oxide film 717 or 718 is not limited to an Al oxide film but may be formed by anodizing another metal film.

The present invention is not limited to the TFT 10 panel of the above embodiment. For example, the present invention can be applied to various types of panels incorporating thin-film transistors, e.g., a circuit panel in which an electronic circuit is constituted by inverse stagger type thin-film transistors.

The TFT elements of the first to fifth embodiments can be applied to liquid crystal elements. A liquid crystal element is so constructed that a thin film transistor panel (a TFT panel), in which pixel electrodes and gate and drain lines for supplying data signals to TFTs are arranged on an insulating substrate in the form of a matrix, is arranged to face an opposing substrate having opposing electrodes formed thereon with a predetermined gap, and a liquid crystal material is sealed in this gap.

Figure 27:
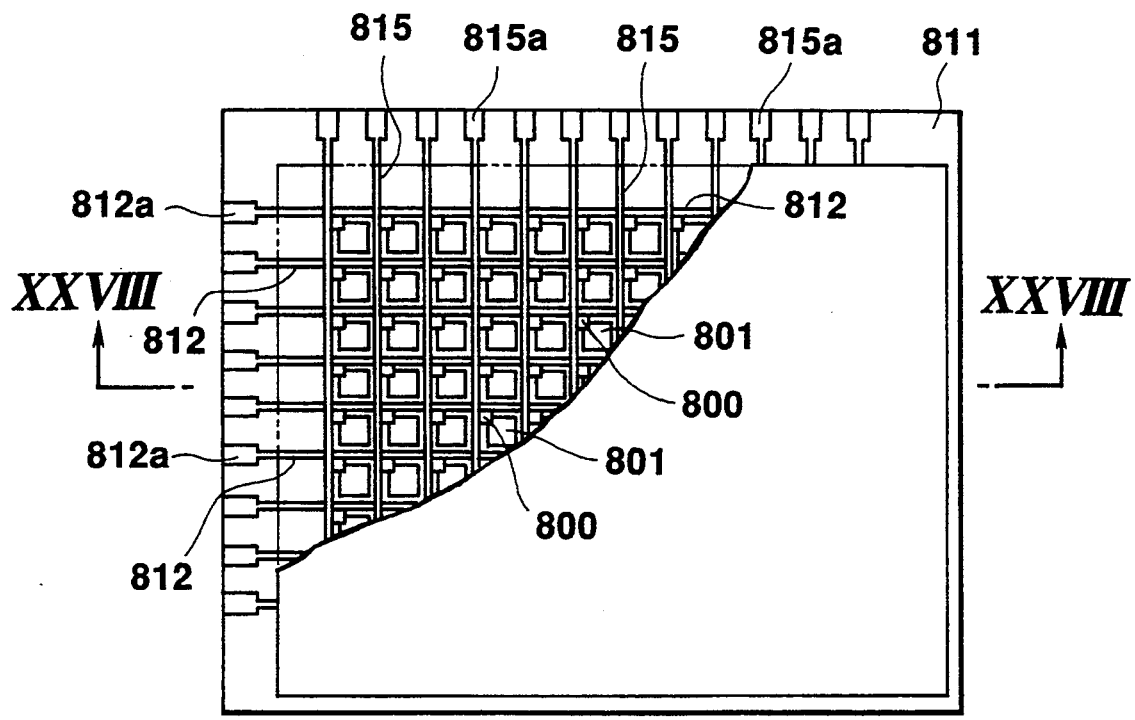
FIG. 27 is a partially cutaway plan view showing the structure of a TFT liquid crystal element to which each embodiment of the present invention is applied.
Figure 28:
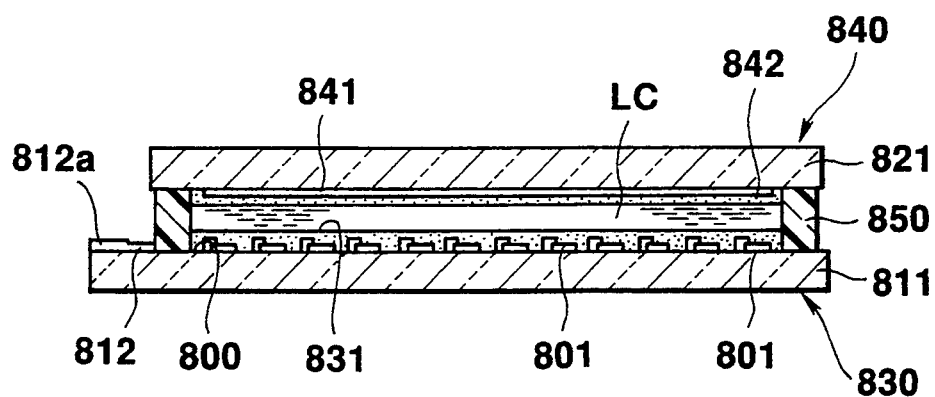
FIG. 28 is a sectional view of the TFT liquid crystal element in FIG. 27 along a line XXVIII—XXVIII thereof.

FIGS. 27 and 28 show the structure of a liquid crystal display element using a TFT element. Referring to FIGS. 27 and 28, a large number of gate lines 812 are formed on the upper surface of a glass substrate 811 in one direction. A terminal portion 812a to be connected to an external driving circuit is formed at one end of each of the gate lines 812. A large number of drain lines 815 are arranged on the upper surface of the substrate 811 in a direction perpendicular to the gate lines 812. A terminal portion 815a to be connected to an external driving circuit is formed at one end of each of the drain lines 815. TFT elements 800 corresponding to the TFTs of each of the first to fifth embodiments and pixel electrodes 801 connected thereto are arranged at the intersections between these gate and drain lines 812 and 815. The gate and drain electrodes of each TFT element 800 are respectively connected to the corresponding gate and drain lines 812 and 815, whereas the source electrode is connected to a corresponding one of the pixel electrodes 801. A TFT panel is constituted by the glass substrate 811, the gate lines 812, the drain lines 815, and the TFT elements 800. An aligning film 831 for aligning liquid crystal molecules in a predetermined direction is formed on the upper surface of the TFT panel.

An opposing substrate 840 arranged to oppose this TFT panel 830 has opposing electrodes 841 formed on the lower surface of a glass substrate 821 to oppose the pixel electrodes 821. In addition, an aligning film 842 for aligning the liquid crystal molecules in a predetermined direction is formed on the opposing electrodes 841.

The TFT panel 830 and the opposing substrate 840 are arranged to oppose each other with a predetermined gap, and a liquid crystal LC is packed in the gap and sealed by a sealing agent 850, thereby forming the TFT panel 830.

An image display operation of this liquid crystal element is performed as follows. Scanning signals are supplied from the driving circuit (not shown), connected to the terminal portions 812a of the gate lines 812, to the gate electrodes of the TFT elements 800 through the gate lines 812, and the TFT elements 800 are turned on by the scanning signals. In synchronism with the scanning signals, desired data signals are supplied from the driving circuit, connected to the terminal portions 815a of the drain lines 815, to the drain electrodes of the TFT elements 800 through the drain lines 815, thereby controlling the respective pixels, constituted by the pixel electrodes 801, the opposing electrodes 841, and the liquid crystal LC, to have transmittances corresponding to the data signals. With this operation, a desired image is displayed on the liquid crystal display element.

As described above, if the TFT element of the present invention is applied to a liquid crystal element, a high-contrast liquid crystal element capable of highly efficient time division driving can be obtained. In addition, active matrix type liquid crystal elements, which allow simplification of the manufacturing process, can be manufactured at a high yield.

Additional advantages and modifications will readily occur to those skilled in the art. Therefore, the invention in its broader aspects is not limited to the specific details, and representative devices shown 10 and described herein. Accordingly, various modifications may be made without departing from the spirit or scope of the general inventive concept as defined by the appended claims and their equivalents.

What is claimed is:
1. A thin-film transistor comprising:
an insulating substrate;
a gate electrode formed on said insulating substrate;
a gate insulating film formed on said gate electrode;
a semiconductor film formed on said gate insulating film facing said gate electrode through the gate insulating film;
ohmic contact layers including n-type semiconductor films doped with an impurity, electrically insulated from each other on said semiconductor film, and electrically connected to said semiconductor film; and
source and drain electrodes arranged above said semiconductor film with a predetermined gap to form a channel portion, and electrically connected to said semiconductor film through said ohmic contact layers, and wherein
at least one of said gate electrode, said ohmic contact layers, and said source and drain electrodes is formed of a conductive film which extends substantially over an entire element region of the thin-film transistor and which is entirely anodized except a predetermined pattern having a predetermined shape forming the at least one of said gate electrode, said ohmic contact layers, and said source and drain electrodes, so as to form a continuous oxide film by a chemical reaction, the continuous oxide film existing without being removed.

2. A transistor according to claim 1, wherein:
said conductive film comprises a metal conductive film; and
said gate electrode is formed of said metal conductive film which is entirely anodized except for a region forming the gate electrode into metal oxide film by a chemical reaction.

3. A transistor according to claim 2, wherein:
said conductive film comprises a substance selected from the group consisting of aluminum and an aluminum alloy;
said gate electrode comprises said substance; and
a portion of said conductive film other than the predetermined pattern is made entirely of aluminum oxide by an anodizing process in the direction of the thickness of said conductive film.

4. A transistor according to claim 2, wherein:
said conductive film comprises tantalum, and said gate electrode comprises tantalum; and
a portion of said conductive film other than the predetermined pattern is entirely comprised of tantalum oxide formed by an anodizing process in the direction of the thickness of said conductive film.

5. A transistor according to claim 1, wherein:
said ohmic contact layers are formed of said conductive film of semiconductor; and
a portion of said conductive film which faces a channel portion of said semiconductor film is entirely comprised of a semiconductor oxide film by chemical reaction in the direction of the thickness of said conductive film.

6. A transistor according to claim 1, wherein said semiconductor film and said ohmic contact layers comprise amorphous silicon.

7. A transistor according to claim 1, wherein:
said conductive film comprises a metal conductive film;
said source and drain electrodes are formed of said metal conductive film; and
said source and drain electrodes are connected to each other through a metal oxide film formed by a chemical reaction in a portion of said metal conductive film which faces a channel portion of said semiconductor film.

8. A transistor according to claim 7, wherein:
said conductive film constitutes said source and drain electrodes and is comprised of aluminum and an aluminum alloy;
said source and drain electrodes are comprised of aluminum and an aluminum alloy; and
a portion of said conductive film facing the channel region of said semiconductor film is entirely anodized in the direction of the thickness thereof so as to be formed into aluminum oxide.

9. A transistor according to claim 1, wherein:
said ohmic contact layers are formed of a semiconductor layer and said source and drain electrodes are formed of a metal film; and
said ohmic contact layers and said source and drain electrodes are electrically insulated from each other through oxide films, each formed by a chemical reaction in entire portions of said semiconductor layer and said metal film which face a channel portion of said semiconductor film.

10. A transistor according to claim 1, further comprising a blocking layer formed on a channel portion of the semiconductor film for preventing etching of the channel portion.

11. A thin-film transistor comprising:
an insulating substrate;
a gate insulating film;
a gate electrode and a semiconductor film formed above said insulating substrate to oppose each other through the gate insulating film;
a blocking layer, made entirely of a metal oxide film formed by a chemical reaction, and formed on a channel portion of said semiconductor film, for preventing etching of the channel portion;
ohmic contact layers comprised of n-type semiconductor films doped with an impurity, and electrically insulated from each other, and being electrically connected to said semiconductor film;
source and drain electrodes arranged with a predetermined gap and electrically connected to said semiconductor film through said ohmic contact layers;
a plurality of transparent pixel electrodes arranged in the form of a matrix and connected to said source electrodes;
first conductive lines formed among said pixel electrodes on said substrate and extending in one direction, each of said first conductive lines being connected to one of said gate and drain electrodes; and
second conductive lines formed among said pixel electrodes on said substrate and extending in a direction perpendicular to said first conductive lines, each of said second conductive lines being connected to the other electrode of said gate and drain electrodes,
said blocking layer being continuously formed on the channel portions of said semiconductor films, and at a portion facing at least one of said first conductive lines and said second conductive lines, and wherein a width of a portion of said blocking layer facing at least one of said first conductive lines and said second conductive lines is smaller than that of said at least one of said first conductive lines and said second conductive lines.

12. A transistor according to claim 11, wherein said blocking layer is made of aluminum oxide formed by anodizing a substance selected from the group consisting of aluminum and an aluminum alloy.

13. A thin-film transistor array comprising: an insulating substrate;
a plurality of pixel electrodes arranged above said insulating substrate in the form of a matrix;
first conductive lines formed among said pixel electrodes on said substrate and extending in one direction;
second conductive lines formed among said pixel electrodes on said substrate and extending in a direction perpendicular to said first conductive lines; and
thin-film transistors arranged on said substrate to correspond to said pixel electrodes, each of said thin-film transistors being arranged such that one of gate and drain electrodes of each of said thin-film transistors is connected to a corresponding one of said first and second conductive lines, and each of said thin-film transistors including:
a gate electrode and a semiconductor film formed to oppose each other through a gate insulating film;
ohmic contact layers comprised of n-type semiconductor films doped with an impurity, electrically insulated from each other on said semiconductor film, and electrically connected to said semiconductor film; and
source and drain electrodes arranged on said semiconductor film with a predetermined gap to form a channel portion, and electrically connected to said semiconductor film through said ohmic contact layers; and wherein at least one of said gate electrode, said ohmic contact-layers, and said source and drain electrodes is formed of a conductive film which extends substantially over an entire element area of the thin-film transistor and is entirely anodized except for a predetermined pattern having a predetermined shape forming the at least one of said gate electrode, said ohmic contact layers, and said source and drain electrodes, so as to form a continuous oxide film by a chemical reaction, the continuous oxide film existing without being removed.

14. An array according to claim 13, wherein:
said conductive film constitutes said ohmic contact layers;
said semiconductor films and said conductive film are made of amorphous silicon; and
a portion of said conductive film which faces a channel portion of said semiconductor film is entirely made of a silicon oxide film formed by a chemical reaction in the direction of the thickness of said conductive film.

15. An array according to claim 13, wherein said conductive film comprises said gate electrode and is made of an aluminum alloy, and a portion of said conductive film other than a portion constituting said gate electrode is entirely made of aluminum oxide by an anodizing process in the direction of thickness of said conductive film.

16. An array according to claim 13, wherein:
said conductive film constitutes said ohmic contact layers and is made of silicon;
a portion of said conductive film which faces a channel portion of said semiconductor film is entirely made of a silicon oxide film formed by a chemical reaction in the direction of thickness of said conductive film.

17. An array according to claim 13, wherein at least one pair of said ohmic contact layers and said source and drain electrodes are formed of said conductive film of semiconductor and are electrically insulated from each other through a metal oxide film by causing a chemical reaction in an entire portion of said conductive film which faces a channel portion of said semiconductor film.

18. An array according to claim 13, further comprising a blocking layer, entirely made of a metal oxide film formed by a chemical reaction, and formed on a channel portion of the semiconductor film for preventing etching of the channel portion.

19. A thin film transistor comprising:
an insulating member;
a gate electrode formed on said insulating member;
a first insulating film formed on said insulating member and integrally formed with said gate electrode, said gate electrode and said first insulating film being formed by anodizing a part of a metal film which occupies an entire transistor forming region of said insulating member;
a second insulating film formed on said gate electrode and on said first insulating film;
a semiconductor layer formed on said second insulating film and facing said gate electrode; and
a source electrode and a drain electrode separated from each other and connected to said semiconductor layer.

20. A thin film transistor according to claim 19, wherein:
an upper surface of said first insulating film is substantially flush with an upper surface of said gate electrode; and
said second insulating film has substantially flat upper surfaces.

21. A thin film transistor comprising:
an insulating member;
a gate electrode formed on said insulating member;
a gate insulating film formed on at least said gate electrode;
a semiconductor layer formed on said gate insulating film and facing to the gate electrode through said gate insulating film;
a source electrode and a drain electrode connected to said semiconductor layer; and
an insulating member provided between said source electrode and said drain electrode, and wherein said source electrode, drain electrode and insulating member are integrally formed with each other by anodizing a portion forming said insulating member of a metal film, remaining portions of said metal film serving as said source and drain electrodes.

22. A thin film transistor according to claim 21, wherein:
an upper surface of said insulating member is substantially flush with upper surfaces of said source and drain electrodes, and
said metal film extends over an entire transistor element forming region of said insulating member.

23. A thin film transistor comprising:
an insulating member;
a gate electrode formed on said insulating member;
a gate insulating film formed on at least said gate electrode;
a semiconductor layer formed on said gate insulating film and facing said gate electrode through said gate insulating film;
first and second ohmic contact layers;
a source electrode ohmically connected to said semiconductor layer through said first ohmic contact layer;
a drain electrode ohmically connected to said semiconductor layer through said second ohmic contact layer; and
an insulating member provided between said first and second ohmic contact layers, said first and second ohmic contact layers and said insulating member being integrally formed with each other by anodizing a portion forming said insulating member of an impurity-doped-semiconductor layer, remaining portions of said impurity-doped-semiconductor layer serving as said first and second ohmic contact layers.

24. A thin film transistor according to claim 23, wherein:
an upper surface of said insulating member is substantially flush with upper surfaces of said first and second ohmic contact layers; and
said impurity-doped-semiconductor layer extends over an entire transistor element forming region of said insulating member.

* * * * *